(12) United States Patent
Cho et al.

(10) Patent No.: US 12,707,831 B2
(45) Date of Patent: Aug. 11, 2026

(54) DISPLAY DEVICE INCLUDING CONNECTION LINE CONNECTED TO SIGNAL LINE

(71) Applicant: Samsung Display Co., LTD., Yongin-si (KR)

(72) Inventors: Seung Hwan Cho, Yongin-si (KR); Jong Hyun Choi, Seoul (KR); Joo Sun Yoon, Seoul (KR); Jong Hyuk Lee, Seoul (KR); Min Jae Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 628 days.

(21) Appl. No.: 17/266,410

(22) PCT Filed: Feb. 25, 2019

(86) PCT No.: PCT/KR2019/002265
§ 371 (c)(1),
(2) Date: Feb. 5, 2021

(87) PCT Pub. No.: WO2020/032338
PCT Pub. Date: Feb. 13, 2020

(65) Prior Publication Data

US 2021/0296424 A1 Sep. 23, 2021

(30) Foreign Application Priority Data

Aug. 7, 2018 (KR) ........................ 10-2018-0091807

(51) Int. Cl.
*H10K 59/131* (2023.01)
*H10D 86/40* (2025.01)
(Continued)

(52) U.S. Cl.
CPC ........... *H10K 59/131* (2023.02); *G09F 9/301* (2013.01); *H10D 86/441* (2025.01); *H10K 77/111* (2023.02); *H10K 2102/311* (2023.02)

(58) Field of Classification Search
CPC ............. H10K 59/131; H10K 59/1315; H10K 59/1216; H01L 27/124; G09G 3/3258; H10D 86/441; H10D 86/60
See application file for complete search history.

(56) References Cited

U.S. PATENT DOCUMENTS

| | | | |
|---|---|---|---|
| 8,537,320 | B2 | 9/2013 | Kwon et al. |
| 8,956,900 | B2 | 2/2015 | Kwon et al. |

(Continued)

FOREIGN PATENT DOCUMENTS

| | | | |
|---|---|---|---|
| CN | 107403825 | A | 11/2017 |
| CN | 107422554 | A | 12/2017 |

(Continued)

OTHER PUBLICATIONS

International Search Report dated Jun. 12, 2019, for corresponding Application No. PCT/KR2019/002265, 4 pages.

(Continued)

*Primary Examiner* — Chad M Dicke
*Assistant Examiner* — Mario Andres Autore, Jr.
(74) *Attorney, Agent, or Firm* — Womble Bond Dickinson (US) LLP

(57) ABSTRACT

A display device includes: a substrate including a display area, and a non-display area at an outer periphery of the display area, the non-display area including a first non-display area and a second non-display area; a plurality of signal lines extending from the non-display area in a first direction at the display area on the substrate; and at least one connection line extending from the first non-display area to the second non-display area by passing through the display (Continued)

area on the substrate. The at least one connection line is connected to any one signal line from among the plurality of signal lines at the second non-display area.

20 Claims, 17 Drawing Sheets

(51) Int. Cl.
*G09F 9/30* (2006.01)
*H10K 77/10* (2023.01)
*H10K 102/00* (2023.01)

(56) References Cited

U.S. PATENT DOCUMENTS 9,430,180 B2 8/2016 Hirakata et al.
9,984,635 B2 5/2018 Lee
10,332,440 B2* 6/2019 Lee .......... G09G 3/20
10,361,223 B2 7/2019 Kim et al.
10,748,981 B1* 8/2020 Rieutort-Louis .... H10K 59/131
10,916,187 B2 2/2021 Kim et al.
12,112,669 B2* 10/2024 Tsai .......... G09G 3/035
2005/0098785 A1* 5/2005 You .......... G02F 1/13458 257/72
2007/0284763 A1* 12/2007 Kim .......... H05K 3/361 257/797
2008/0117497 A1* 5/2008 Shimodaira .......... G02F 1/1345 361/748
2009/0096975 A1 4/2009 Kwon et al.
2009/0115690 A1* 5/2009 Chang .......... G09G 3/006 345/55
2010/0156945 A1* 6/2010 Yoshida .......... G09G 3/3648 345/84
2010/0214247 A1* 8/2010 Tang .......... G06F 3/04164 200/600
2011/0096258 A1* 4/2011 Shim .......... H01L 27/1255 438/34
2011/0242027 A1* 10/2011 Chang .......... G06F 3/047 345/173
2012/0218219 A1* 8/2012 Rappoport .......... H10K 59/179 345/174
2013/0270582 A1* 10/2013 Shin .......... H01L 33/08 257/88
2013/0295702 A1 11/2013 Kwon et al.
2014/0055702 A1 2/2014 Park et al.
2014/0098495 A1* 4/2014 Jeon .......... H05K 7/20136 361/695
2015/0173232 A1* 6/2015 Chai .......... G02F 1/1345 361/748
2015/0379955 A1 12/2015 Jeon et al.
2016/0351107 A1* 12/2016 Chen .......... G02F 1/1345
2016/0357041 A1* 12/2016 Jiang .......... G02F 1/136286
2016/0372534 A1 12/2016 Lee
2017/0185193 A1* 6/2017 Kim .......... G02F 1/133345
2017/0288002 A1* 10/2017 Kim .......... H10K 59/121
2017/0288003 A1* 10/2017 Kim .......... H10K 59/123
2017/0337865 A1* 11/2017 Kim .......... H10K 59/131
2017/0337873 A1* 11/2017 Kim .......... G09G 3/3233
2017/0357113 A1* 12/2017 Yamazaki .......... G02F 1/1335
2017/0357122 A1 12/2017 Oh
2017/0358641 A1* 12/2017 Park .......... H10K 59/1213
2017/0372661 A1* 12/2017 Gu .......... H10K 59/131
2018/0074361 A1* 3/2018 Chung .......... F21V 33/0052
2018/0197484 A1* 7/2018 Moon .......... G09G 3/3233
2018/0204895 A1* 7/2018 Lin .......... G09G 3/3233
2018/0331124 A1* 11/2018 Cho .......... H10D 86/60
2018/0366494 A1* 12/2018 Lee .......... H10D 86/021
2019/0043418 A1* 2/2019 Rieutort-Louis .... G09G 3/3266
2019/0081128 A1* 3/2019 Yu .......... H10K 59/131
2019/0103455 A1* 4/2019 Song .......... H10K 59/131
2019/0131360 A1* 5/2019 Lee .......... H10K 59/131
2019/0181363 A1* 6/2019 Lee .......... H10K 59/131
2019/0189075 A1* 6/2019 Kim .......... G02F 1/136204
2019/0206976 A1* 7/2019 Jeong .......... G09G 3/3225
2019/0278145 A1* 9/2019 Tanaka .......... G02F 1/136286
2019/0285955 A1* 9/2019 Yoshida .......... G02F 1/136286
2019/0377385 A1* 12/2019 Bushnell .......... G02F 1/133308
2019/0393295 A1* 12/2019 Moy .......... H10K 59/8792
2020/0090559 A1* 3/2020 Song .......... G02F 1/1345
2020/0136069 A1* 4/2020 Paek .......... H10K 59/8794
2020/0388230 A1* 12/2020 Lee .......... G09G 3/3275
2020/0411627 A1* 12/2020 Mochizuki .......... H10K 59/131
2021/0091165 A1* 3/2021 Jeon .......... H10K 59/1216
2021/0265451 A1* 8/2021 Son .......... H10K 59/131

FOREIGN PATENT DOCUMENTS

KR 10-2008-0079854 A 9/2008
KR 10-2009-0038670 A 4/2009
KR 10-2015-0078593 A 7/2015
KR 10-2015-0094879 A 8/2015
KR 10-2015-0111022 A 10/2015
KR 10-2015-0118395 A 10/2015
KR 10-2016-0002511 A 1/2016
KR 10-2016-0100139 A 8/2016
KR 10-2017-0087574 A 7/2017
KR 10-2017-0131762 A 11/2017
KR 10-2017-0132399 A 12/2017
KR 10-2018-0125061 A 11/2018

OTHER PUBLICATIONS

Chinese Office Action for CN Application No. 201980053255.5 dated Feb. 18, 2024, 8 pages.

* cited by examiner

【FIG. 1】
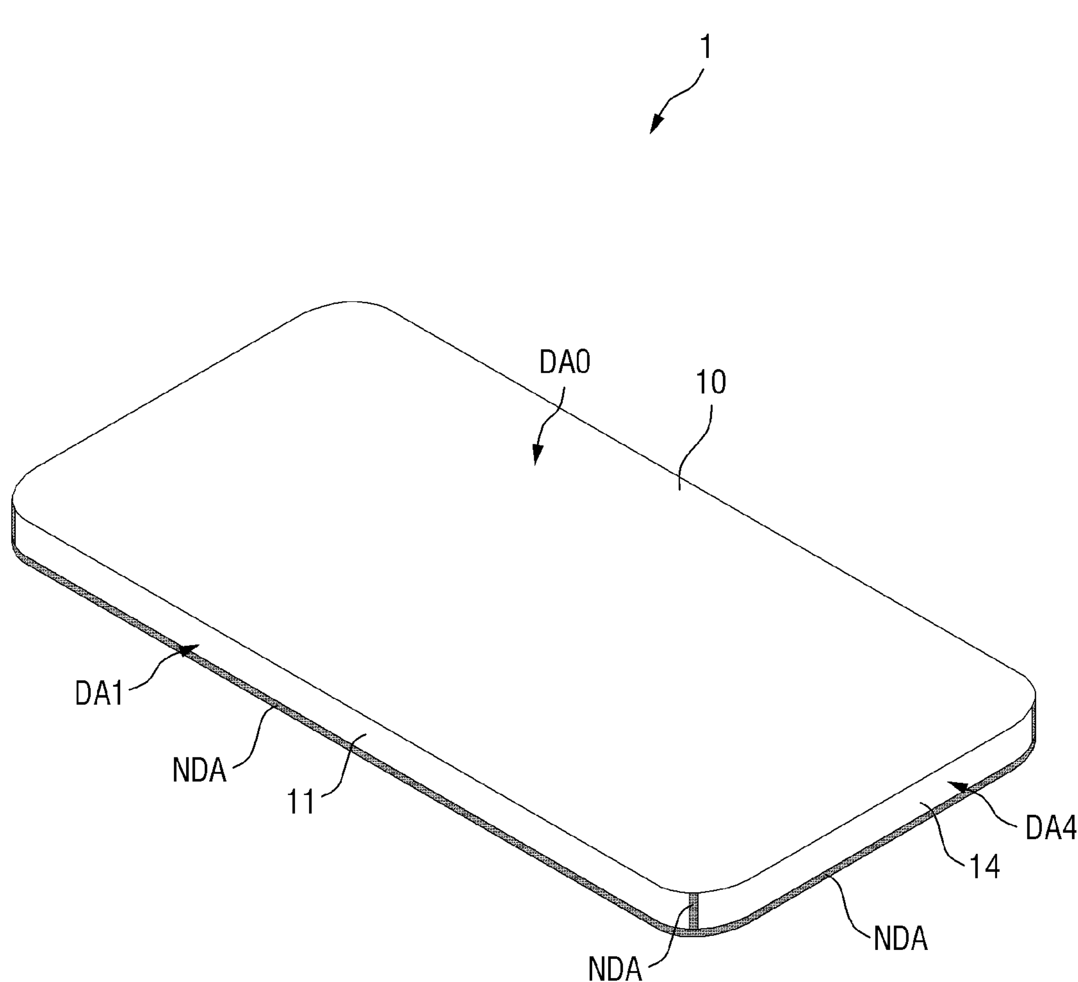

【FIG. 2】
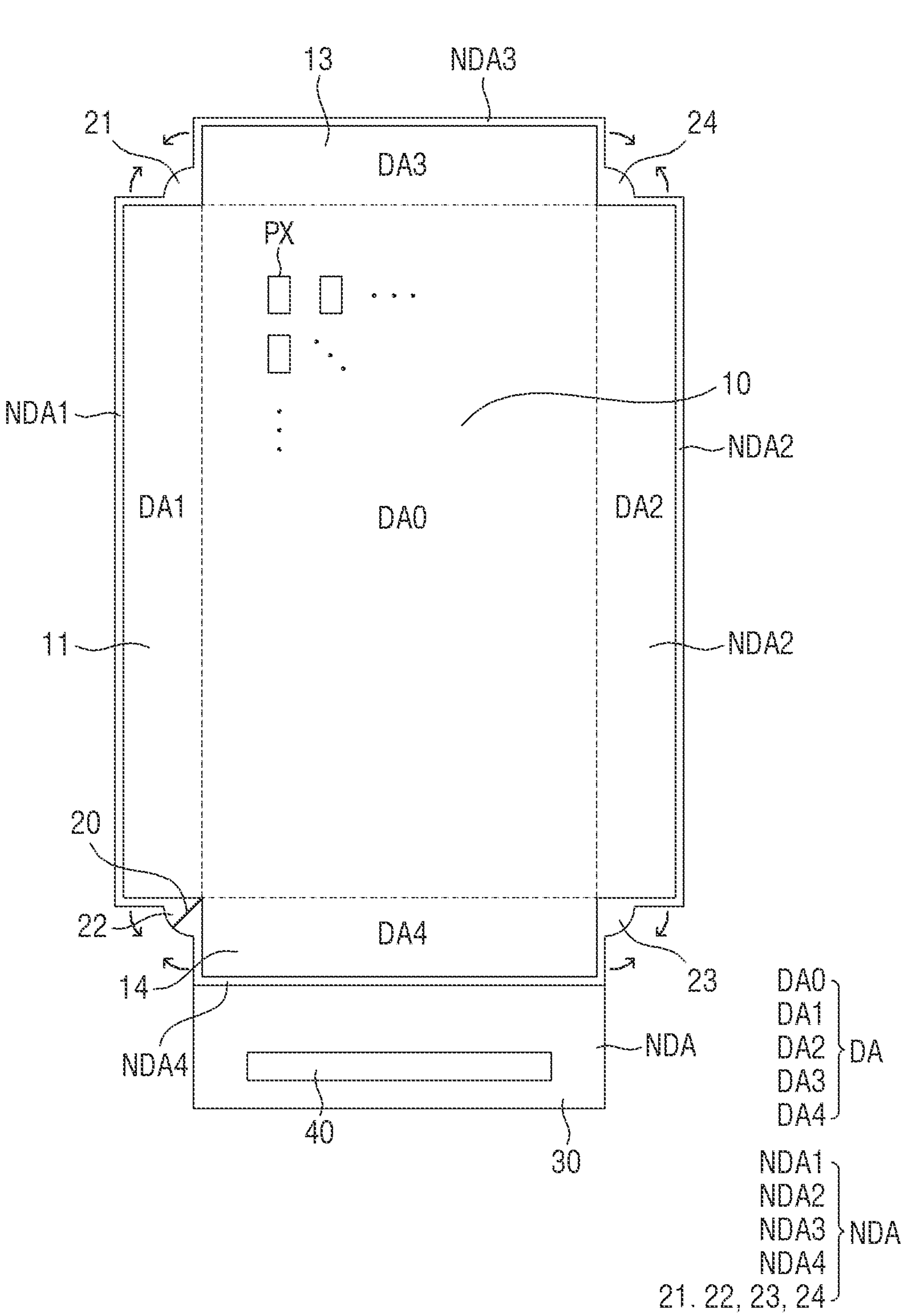

【FIG. 3】
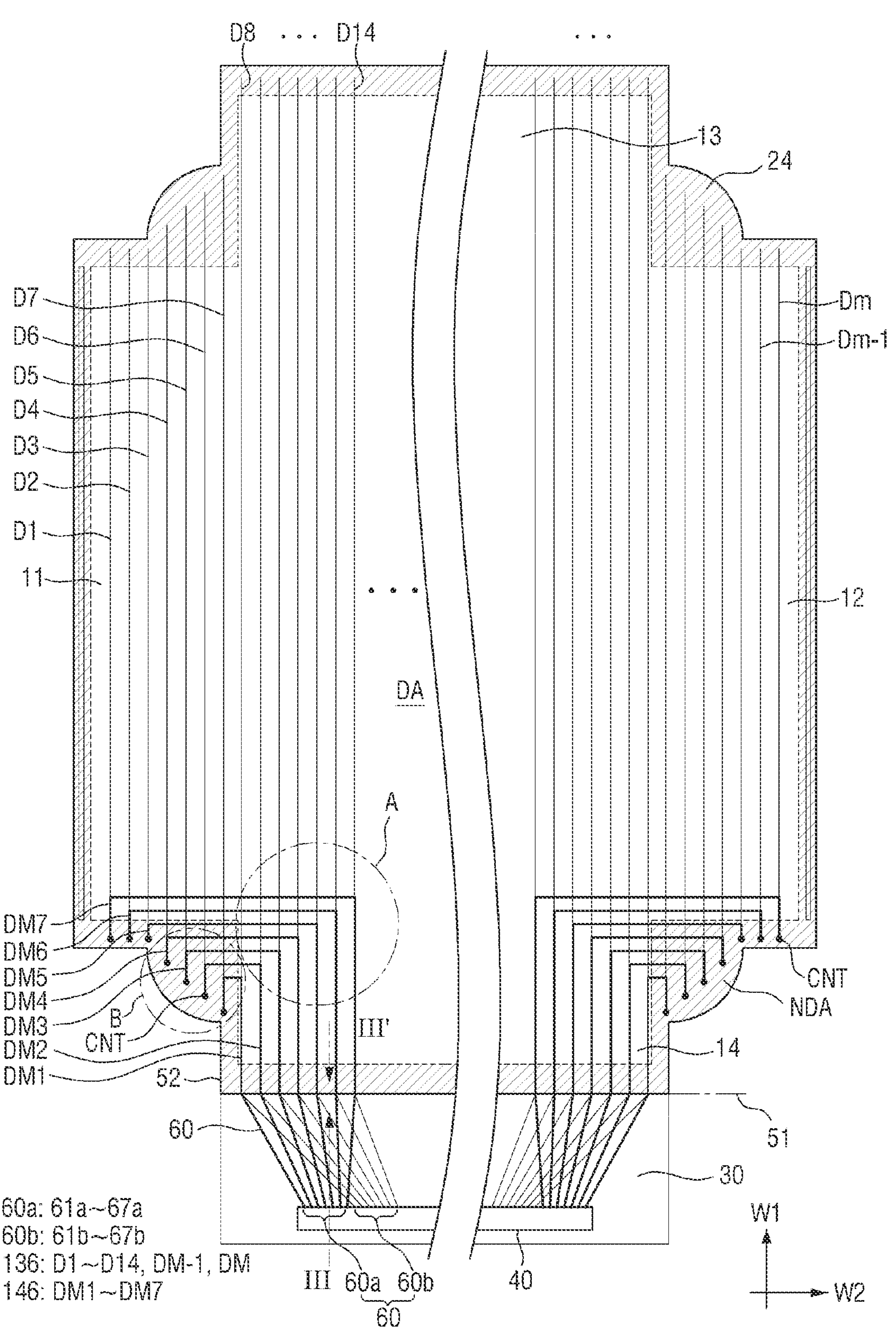

【FIG. 4】
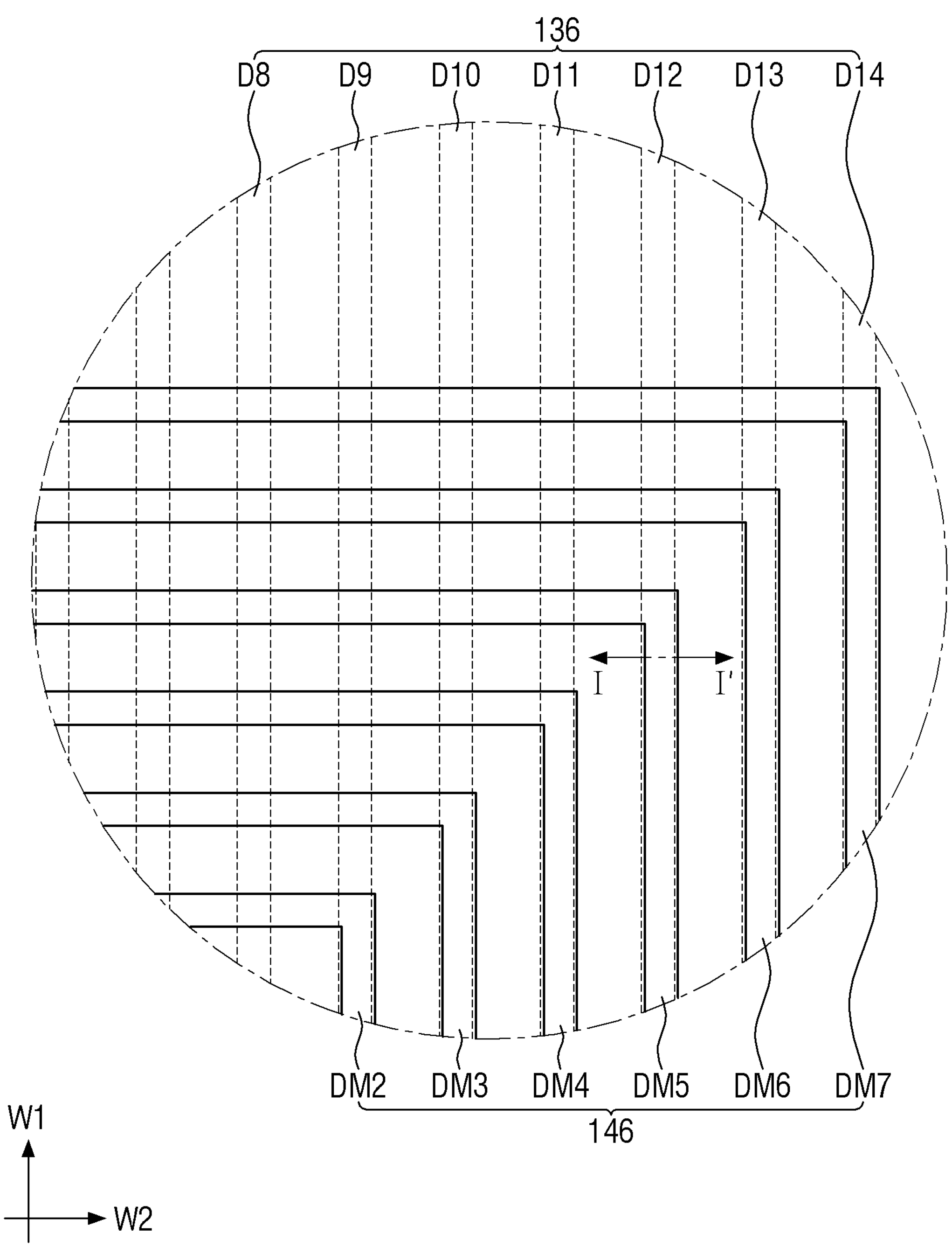

【FIG. 5】
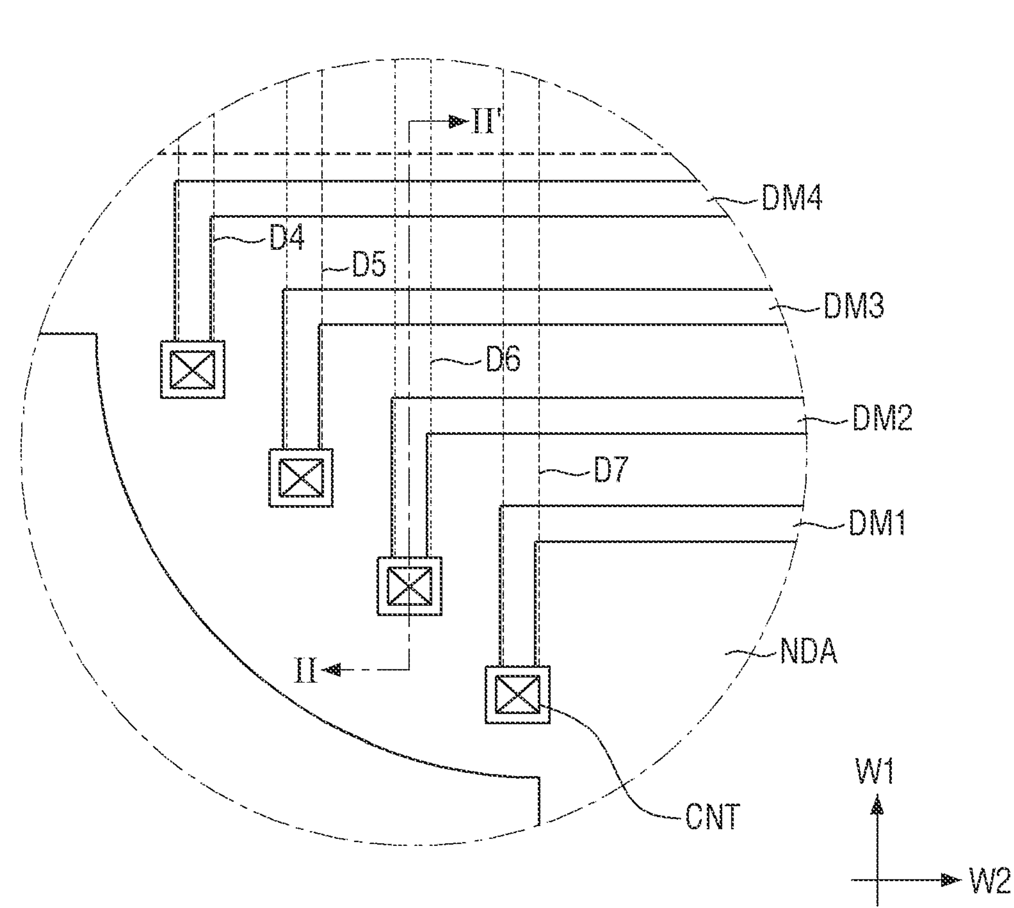

【FIG. 6】
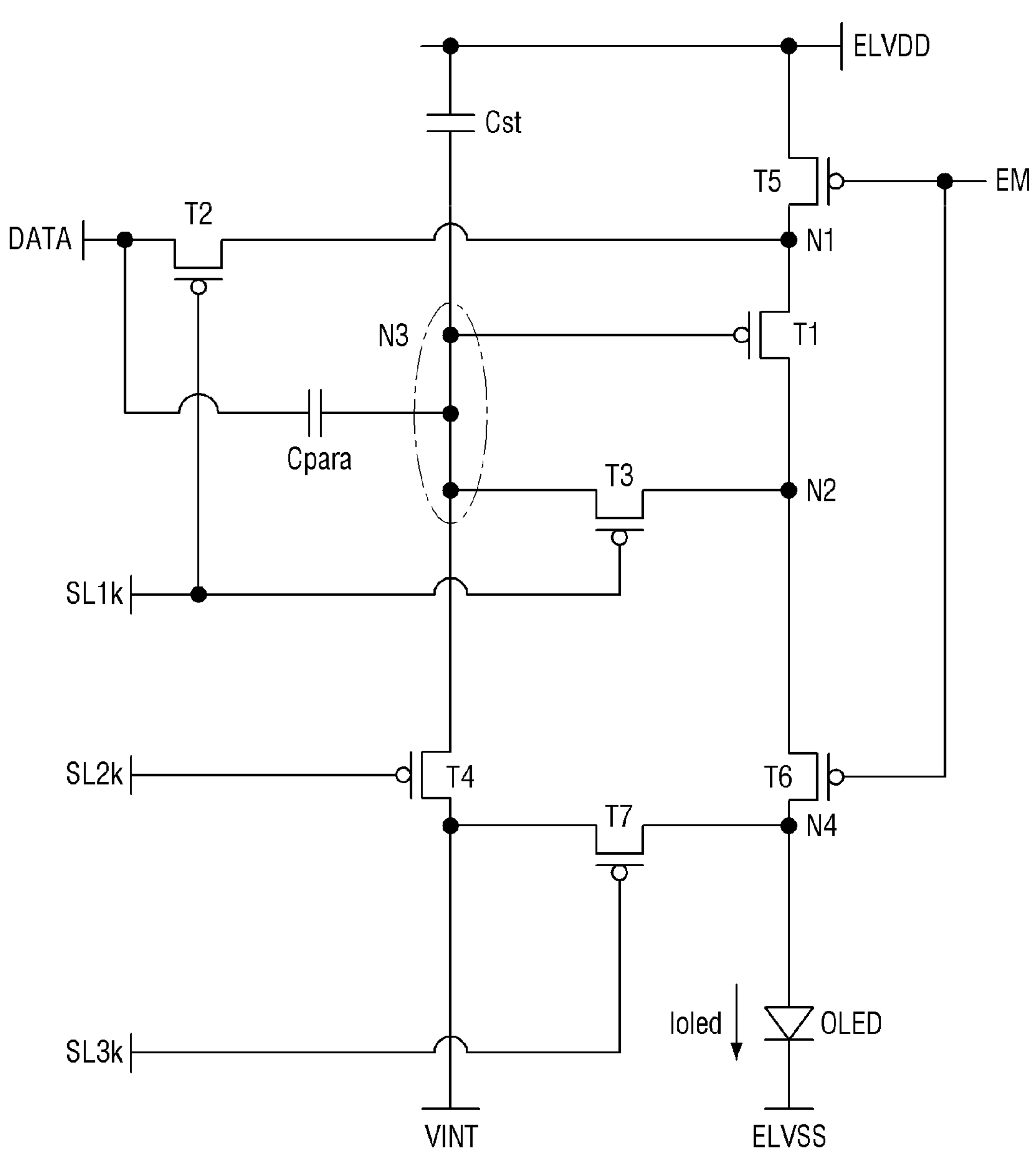

【FIG. 7】
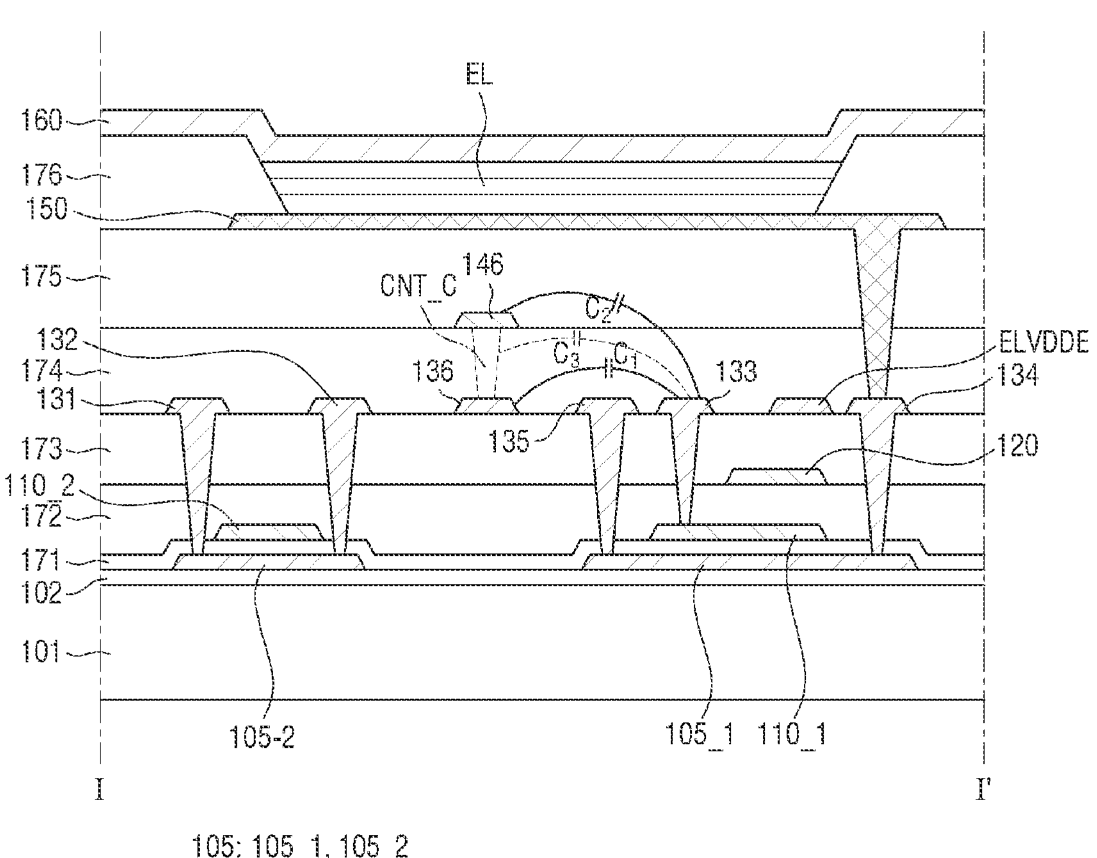
105: 105_1, 105_2
110: 110_1, 110_2
120: 121
130: 131, 132, 133, 134, 135, 136, 137
140: 146
150: 151

【FIG. 8】
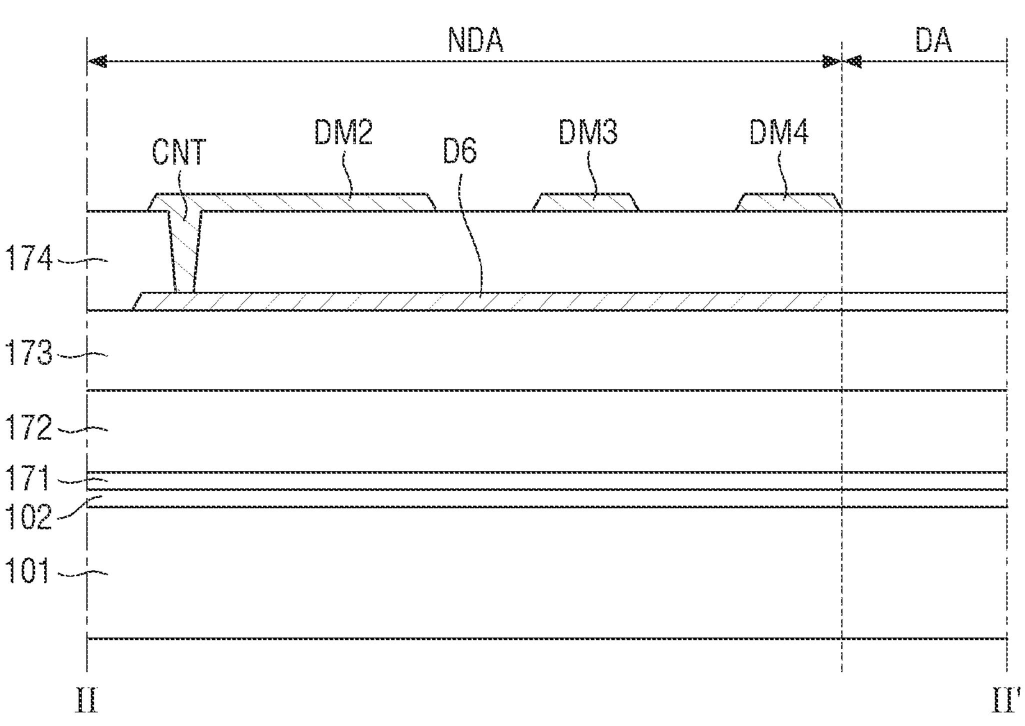
130: D6
140: DM2, DM3, DM4

【FIG. 9】
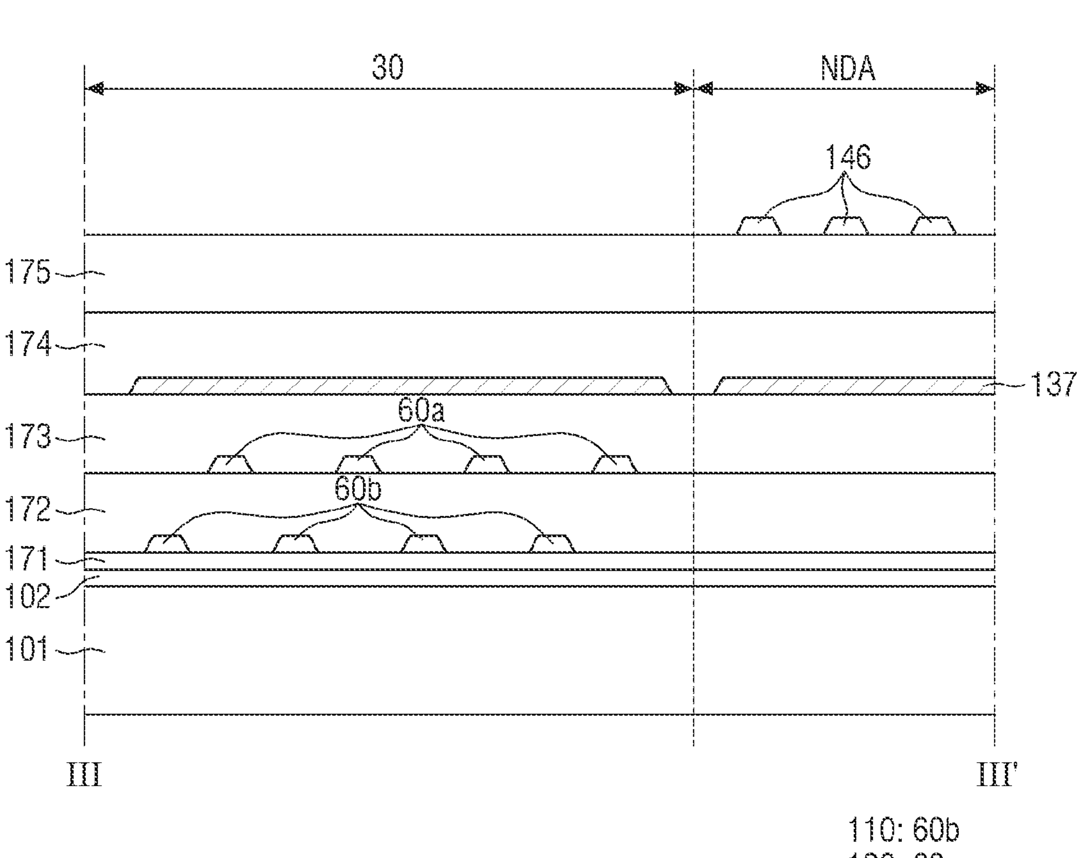

【FIG. 10】
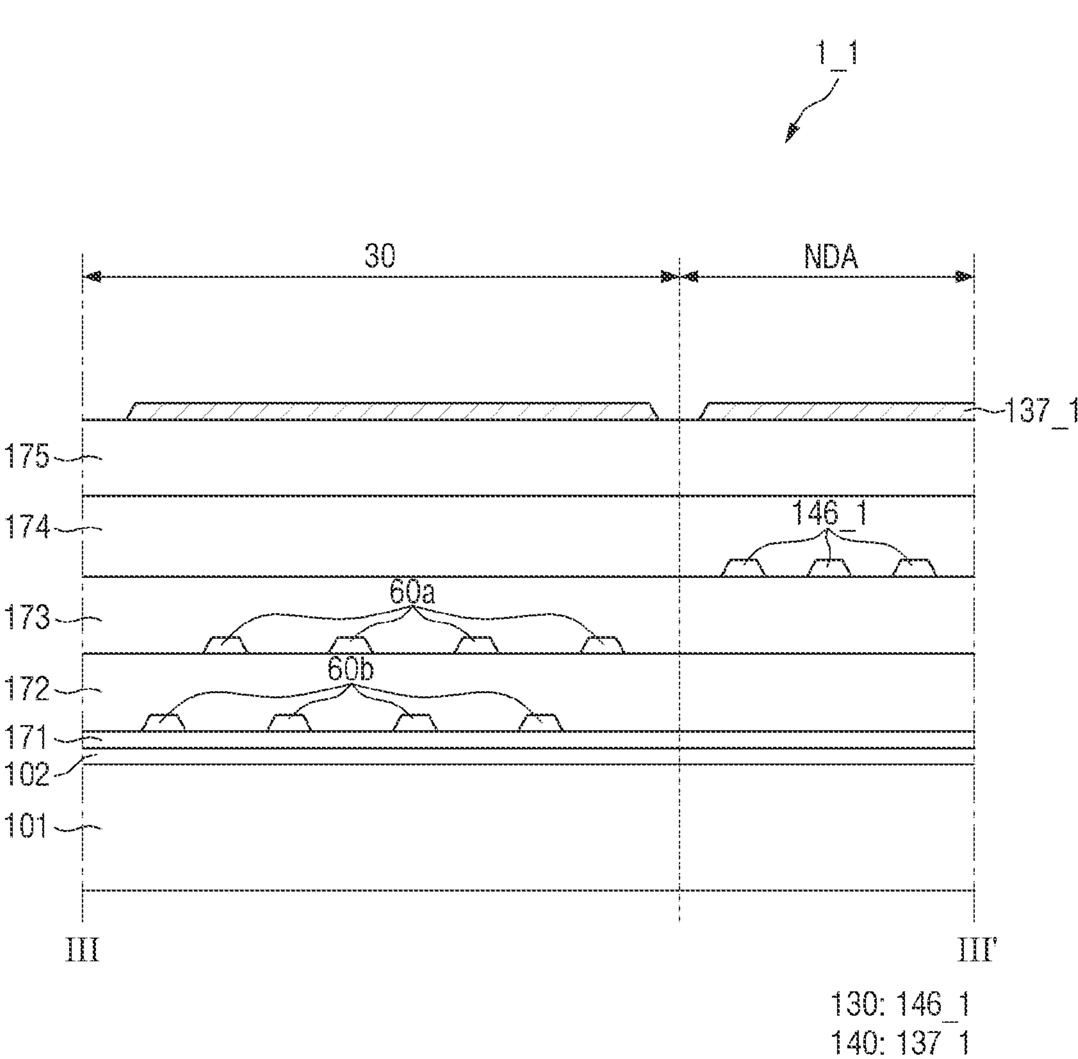

【FIG. 11】
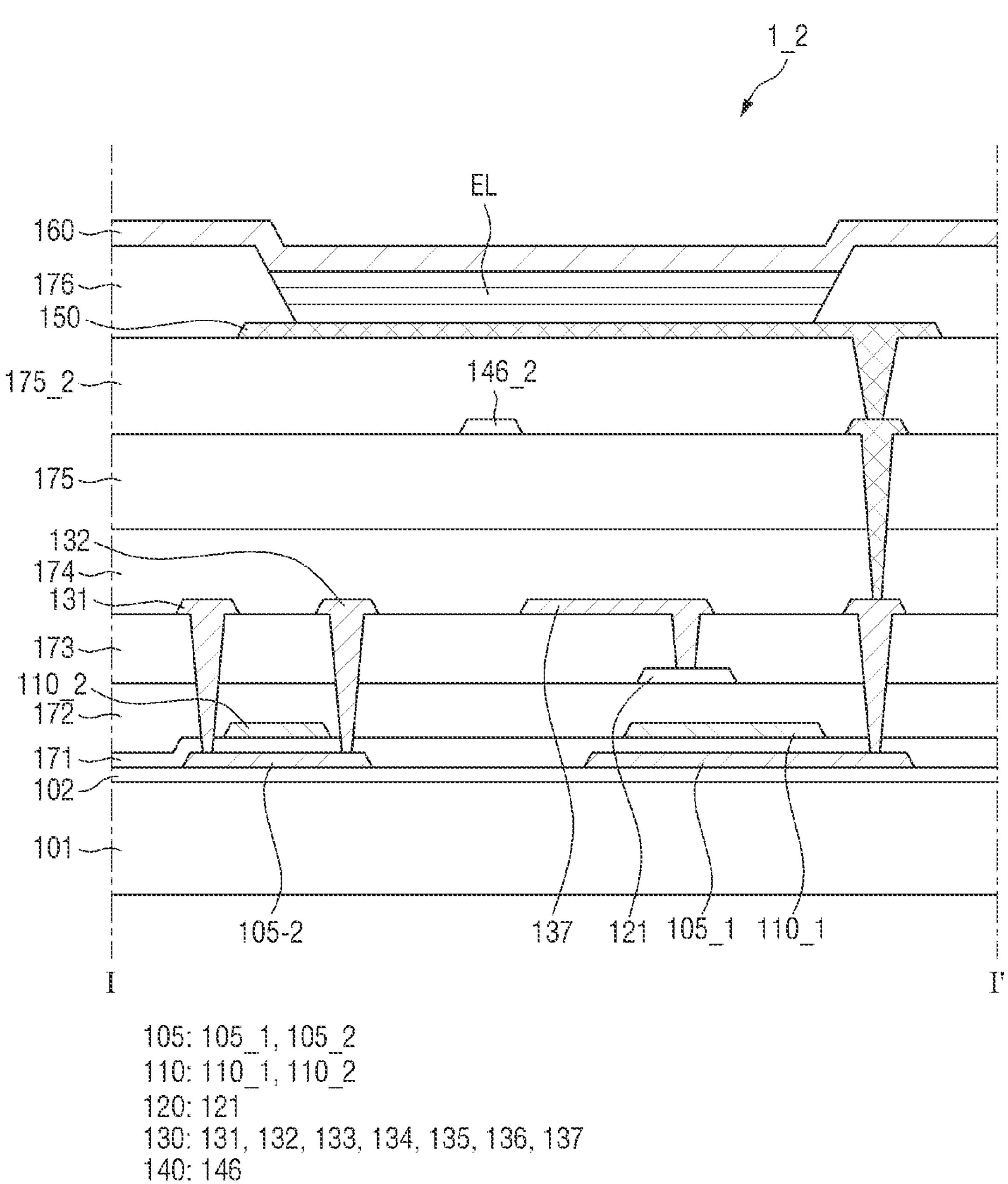
105: 105_1, 105_2
110: 110_1, 110_2
120: 121
130: 131, 132, 133, 134, 135, 136, 137
140: 146
150: 151

【FIG. 12】
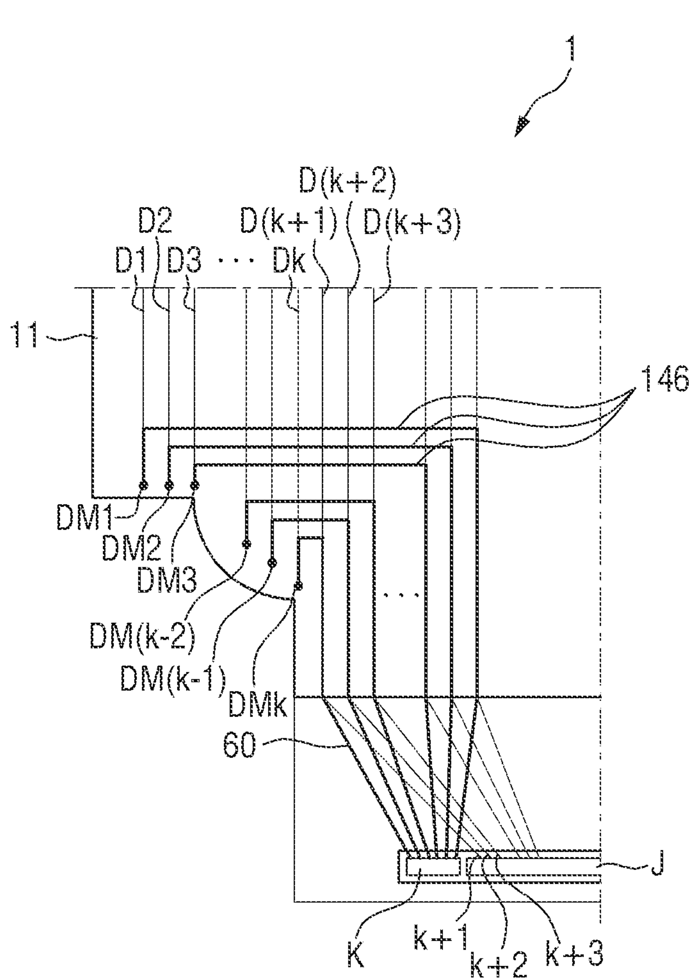

【FIG. 13】
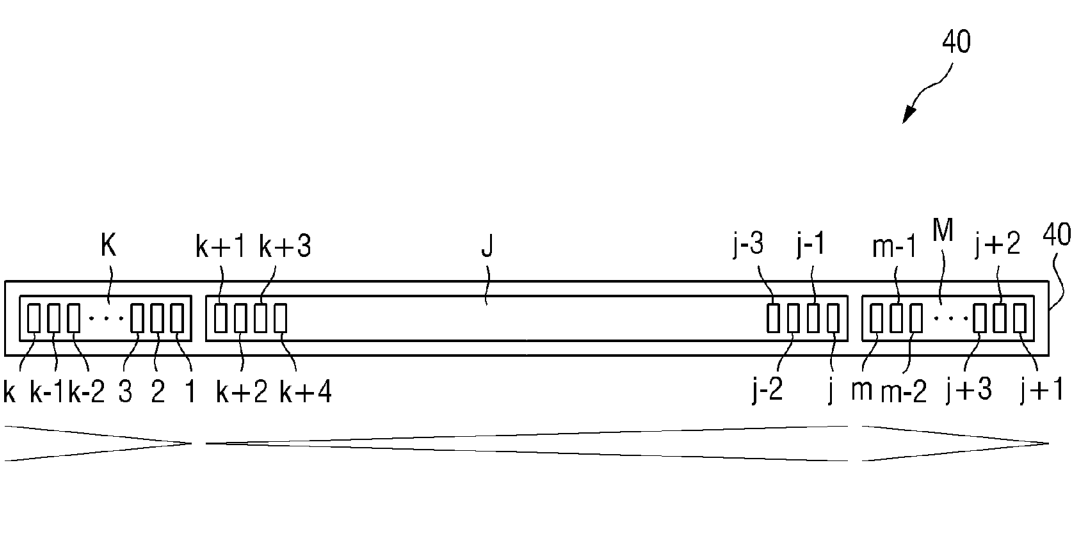

【FIG. 14】
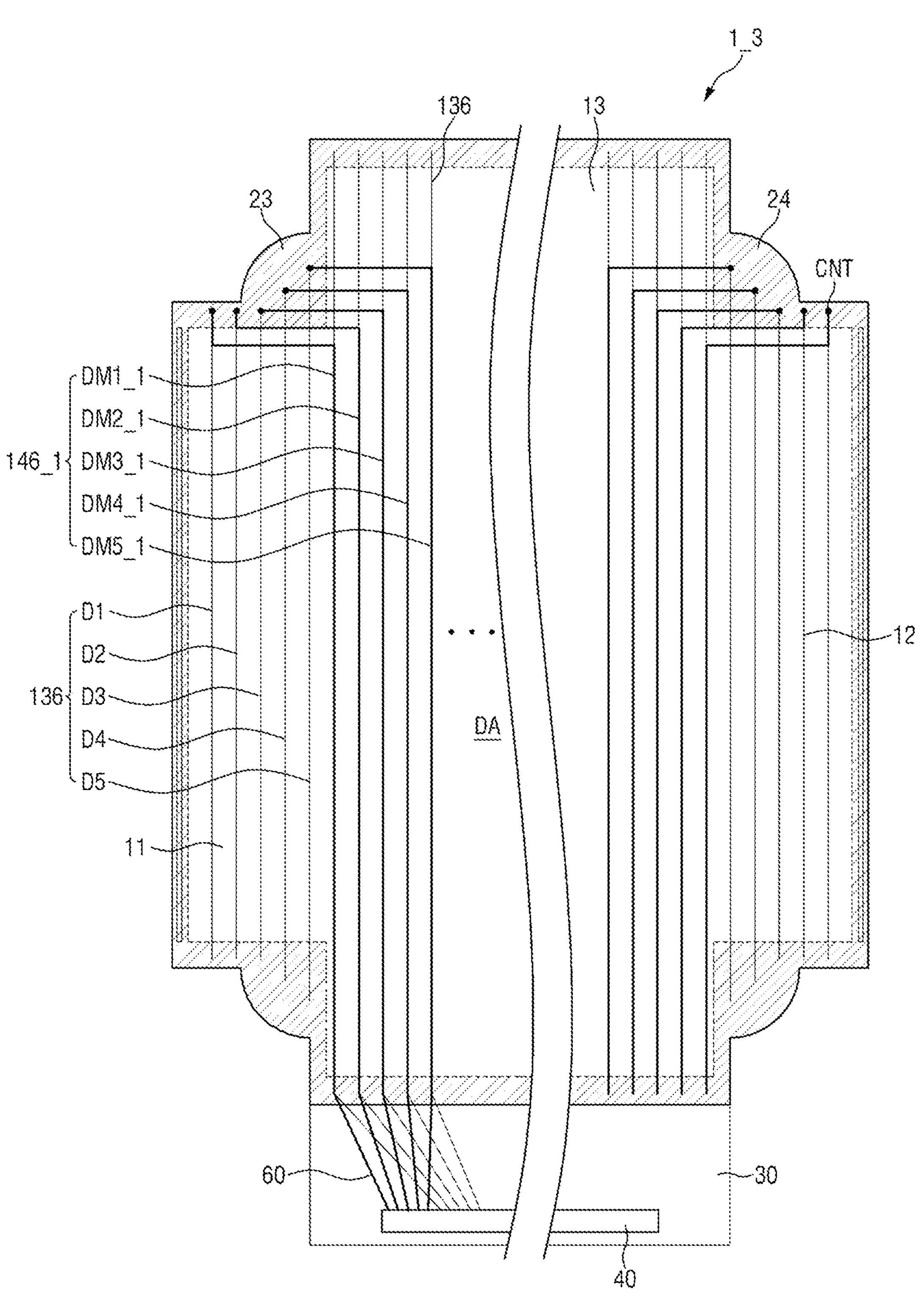

【FIG. 15】
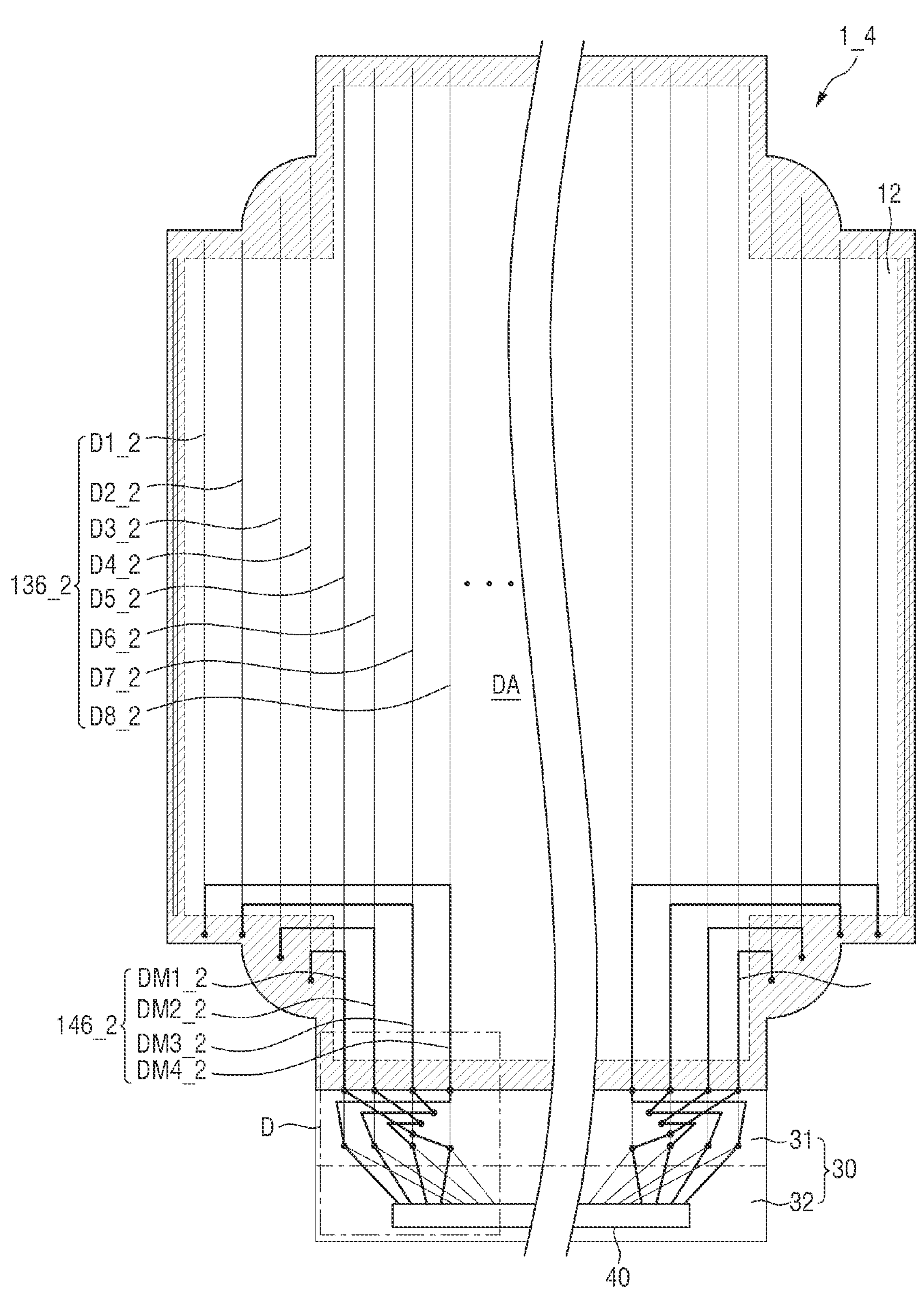

【FIG. 16】
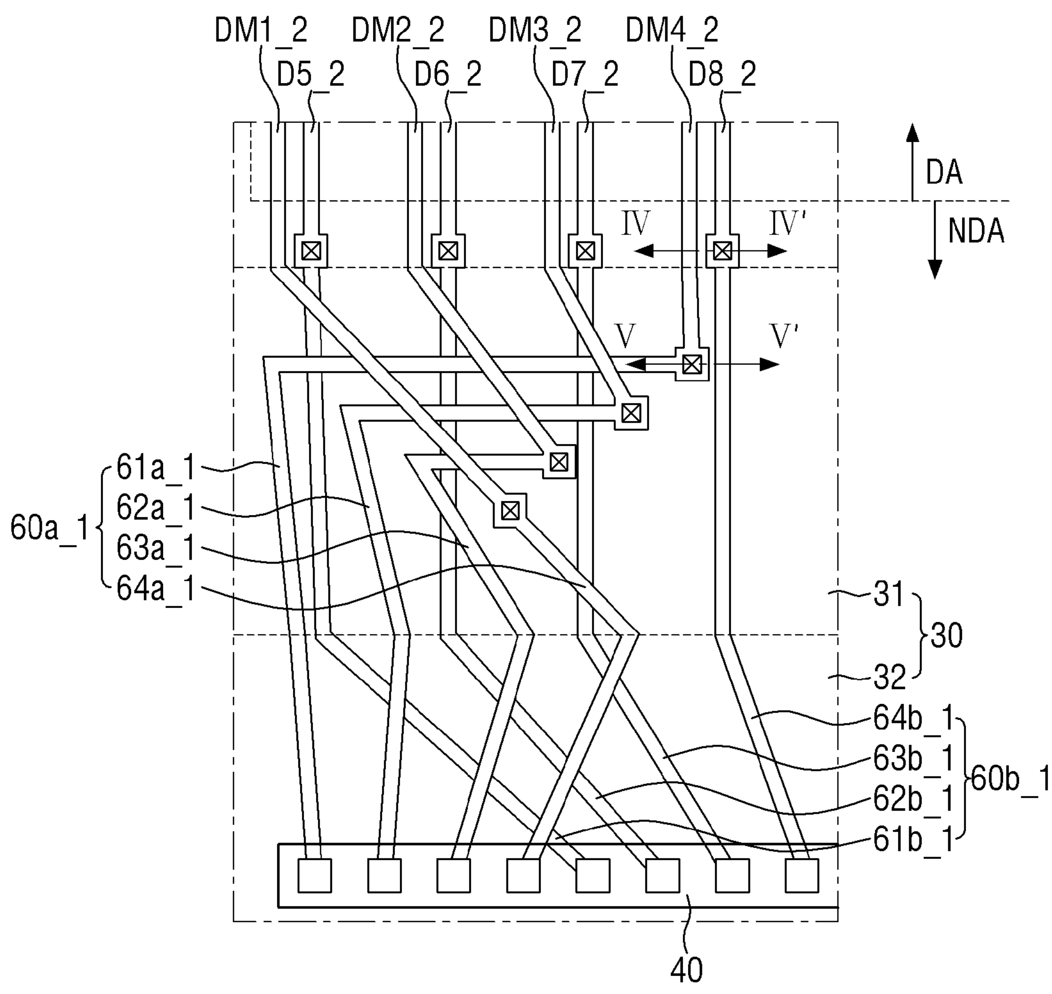
60_1 : 60a_1, 60b_1
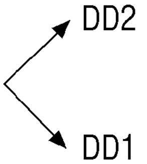

【FIG. 17】
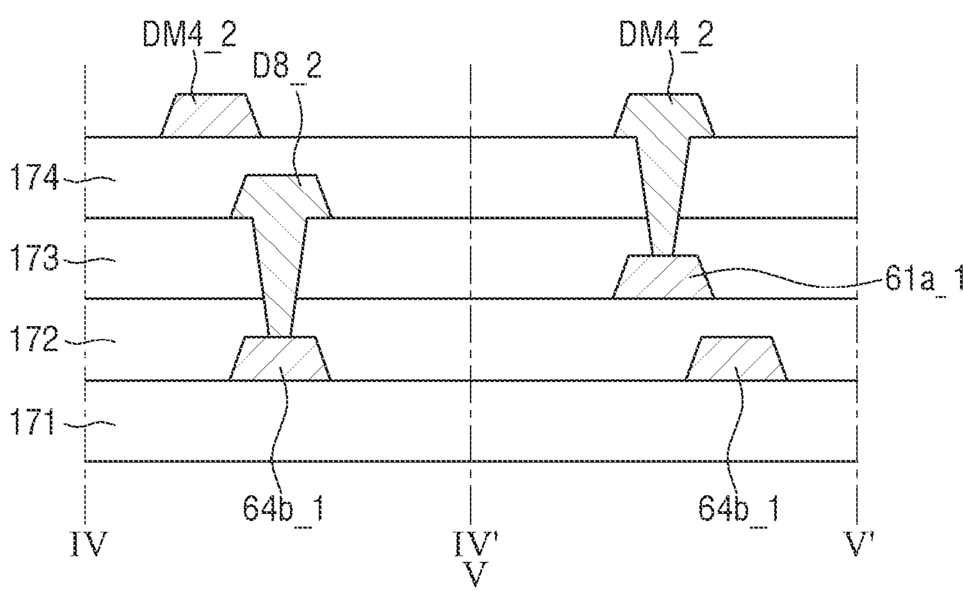

DISPLAY DEVICE INCLUDING CONNECTION LINE CONNECTED TO SIGNAL LINE

CROSS-REFERENCE TO RELATED APPLICATION

This application is a U.S. National Phase Patent Application of International Application No. PCT/KR2019/002265, filed on Feb. 25, 2019, which claims priority to Korean Patent Application No. 10-2018-0091807, filed on Aug. 7, 2018, the entire content of all of which is incorporated by reference herein.

TECHNICAL FIELD

Aspects of embodiments of the present disclosure relate to a display device.

BACKGROUND ART

With the development of multimedia, display devices are becoming more important. Various types of display devices, for example, such as liquid crystal display (LCD) devices, organic light-emitting diode (OLED) display devices, and the like, are being used.

Among the display devices, the OLED display devices display images using OLEDs, which generate light due to the recombination of electrons and holes. The OLED display devices have fast response speeds, high brightness, and large viewing angles, and may be driven with low power consumption.

Meanwhile, the display devices generally display images on only front surfaces thereof. However, display devices that display images even on side surfaces thereof are being developed.

The above information disclosed in this Background section is for enhancement of understanding of the background of the present disclosure, and therefore, it may contain information that does not constitute prior art.

DISCLOSURE

Technical Problem

A display device transmits image signals to a display area through signal lines that are disposed in parallel. The display area may include a front display area, and a side display area located in a direction that is perpendicular to or substantially perpendicular to an extension direction of the signal lines based on the front display area. In order to additionally arrange signal lines for transmitting image signals to the side display area, an area of the signal lines may be increased, and the non-display area of the display device that is used as the area of the signal lines may be increased.

Embodiments of the present disclosure are directed to providing a display device in which a non-display area of the display device is reduced or minimized, and degradation of display quality thereof is prevented or substantially prevented.

The technical problems to be solved by the present disclosure are not limited to the above-discussed technical problems, and other technical problems which are not discussed may be clearly understood by those skilled in the art to which the present disclosure pertains from the following description.

Technical Solution

According to an embodiment of the present disclosure, a display device includes: a substrate including a display area, and a non-display area formed at an outer periphery of the display area; a plurality of signal lines extending from the non-display area in a first direction to be formed in the display area on the substrate; and at least one connection line extending from a first non-display area of the non-display area to a second non-display area of the non-display area by passing through the display area on the substrate. The at least one connection line is connected to any one signal line from among the plurality of signal lines in the second non-display area.

The at least one connection line may include a plurality of connection lines, and the plurality of connection lines may have different lengths from each other.

The second non-display area maybe adjacent to the first non-display area, and a length of a first connection line from among the plurality of connection lines may be longer than a length of a second connection line from among the plurality of connection lines.

The plurality of connection lines may be spaced apart from each other, and may not cross each other in the display area.

The at least one connection line may include a first portion extending in the first direction, and the first portion may overlap with one signal line from among the signal lines in a thickness direction of the substrate.

The at least one connection line may further include a second portion extending from one end of the first portion in the second direction.

The at least one connection line may further include a third portion extending from one end of the second portion in the first direction, and the third portion may be spaced apart from the first portion.

The first non-display area may include a corner protruding from an edge of the display area, one end of a first signal line from among the signal lines may be located in the corner, a second signal line from among the signal lines may be spaced apart from the corner, and the first signal line may be longer than the second signal line.

The display device may further include an insulating layer configured to insulate the at least one connection line from the signal lines, a contact hole may be formed in the second non-display area to pass through the insulating layer to expose the any one signal line from among the signal lines, and the at least one connection line may be directly connected to the any one signal line from among the signal lines through the contact hole.

The display device may further include a plurality of drive lines sequentially disposed in a drive area of the substrate in the second direction, the drive area may be adjacent to the second non-display area, and may be spaced apart from the display area, at least one drive line from among the drive lines may be directly connected to the at least one connection line, and other remaining drive lines from among the drive lines may be directly connected to at least one of the signal lines.

The display device may further include a first insulating layer and a second insulating layer that are sequentially disposed between the at least one drive line and the other remaining drive lines, and a power supply voltage line disposed between the first insulating layer and the second insulating layer.

The display device may further include an insulating layer disposed on the drive lines on the substrate, and a power supply voltage line disposed on the insulating layer.

The display device may further include power supply voltage lines disposed between the signal lines on the substrate, the power supply voltage lines may be electrically connected to each other, the at least one connection line may include a first portion extending in the first direction, and the first portion may overlap with one power supply voltage line from among the power supply voltage lines in a thickness direction of the substrate.

The at least one connection line may include a plurality of connection lines, and the plurality of connection lines may have the same length as each other.

The second non-display area may be spaced apart from the first non-display area, and the plurality of connection lines may cross the display area.

The display device may further include a plurality of drive lines sequentially disposed in a drive area of the substrate in the second direction, the drive area may be adjacent to the second non-display area, may be spaced apart from the display area, and may include pads connected to external devices, at least one drive line from among the drive lines may be directly connected to the at least one connection line, and other remaining drive lines from among the drive lines may be directly connected to at least one of the signal lines.

The at least one drive line may be disposed in a layer different from a layer in which the other remaining drive lines are disposed to be insulated from the other remaining drive lines, and the at least one drive line may be electrically connected to the at least one connection line through a contact hole formed in the drive area.

According to an embodiment of the present disclosure, a display device includes: a display area; a non-display area; a substrate; a driving element layer disposed on the substrate, and including a transistor formed in the display area; a first insulating layer disposed on the driving element layer; a first conductive layer disposed on the first insulating layer, and including a signal line electrically connected to a first electrode of the transistor; a second insulating layer disposed on the first conductive layer; and a second conductive layer disposed on the second insulating layer, and including a connection line electrically connected to the signal line. The connection line is directly connected to the signal line through a contact hole passing through the second insulating layer in the non-display area.

The connection line may overlap with the signal line in the display area.

The first conductive layer may further include a first power supply voltage line electrically connected to a second electrode of the transistor, and the connection line may overlap with the first power supply voltage line in the display area.

Advantageous Effects

In accordance with a display device according to one or more embodiments of the present disclosure, connection lines that are arranged at (e.g., in or on) a display area to transmit image signals to signal lines arranged at (e.g., in or on) a specific display area (for example, a side display area) may be included, so that a dead space of the display device may be reduced.

In accordance with a display device according to one or more embodiments of the present disclosure, the connection lines may be arranged to extend to a non-display area via the display area, and may be connected to the signal lines through contact holes formed in the non-display area, so that degradation of the display quality due to the contact holes may be prevented or substantially prevented.

DESCRIPTION OF DRAWINGS

The above and other aspects and features of the present disclosure will become more apparent to those skilled in the art from the following detailed description of the example embodiments with reference to the accompanying drawings.

FIG. 1 is a perspective view illustrating a display device according to an embodiment.

FIG. 2 is a developed view illustrating an unfolded state of the display device of FIG. 1.

FIG. 3 is a plan view illustrating an example of the display device of FIG. 1.

FIG. 4 is an enlarged view illustrating the area A of FIG. 3.

FIG. 5 is an enlarged view illustrating the area B of FIG. 3.

FIG. 6 is a circuit diagram illustrating an example of a pixel included in the display device of FIG. 1.

FIG. 7 is a cross-sectional view illustrating an example of the display device taken along the line I-' of FIG. 4.

FIG. 8 is a cross-sectional view illustrating an example of the display device taken along the line II-II' of FIG. 5.

FIG. 9 is a cross-sectional view illustrating an example of the display device taken along the line III-III' of FIG. 3.

FIG. 10 is a cross-sectional view illustrating another example of the display device taken along the line III-III' of FIG. 3.

FIG. 11 is a cross-sectional view illustrating another example of the display device taken along the line I-I' of FIG. 4.

FIGS. 12 and 13 are diagrams illustrating an example of a connection relationship between connection lines and a driving chip of the display device of FIG. 1.

FIG. 14 is a plan view illustrating another example of the display device of FIG. 1.

FIG. 15 is a plan view illustrating another example of the display device of FIG. 1.

FIG. 16 is an enlarged view illustrating the area D of FIG. 15.

FIG. 17 is a cross-sectional view illustrating an example of the display device taken along the lines IV-IV' and V-V' of FIG. 16.

MODES OF THE INVENTION

Hereinafter, example embodiments of the present disclosure will be described in more detail with reference to the accompanying drawings. Advantages and features of the present disclosure, and methods for achieving them, will be made clear from the embodiments described in more detail below with reference to the accompanying drawings. The present disclosure may, however, be implemented in various different forms, and should not be construed as being limited to the embodiments set forth herein. Thus, the embodiments are provided such that this disclosure will be thorough and complete, and will fully convey the spirit and scope of the present disclosure to those skilled in the art to which the present disclosure pertains, and the present disclosure is defined by only the scope of the appended claims, and their equivalents. The same reference symbols are used to refer to the same components throughout this disclosure.

Unless defined otherwise, all terms (including technical and scientific terms) used herein may be used in a sense commonly understood by those skilled in the art to which this present disclosure pertains. Further, terms which are defined in a commonly used dictionary are not ideally or excessively interpreted unless explicitly defined otherwise.

It will be understood that when an element or layer is referred to as being "on," "connected to," or "coupled to" another element or layer, it can be directly on, connected to, or coupled to the other element or layer, or one or more intervening elements or layers may be present.

Hereinafter, embodiments of the present disclosure will be described in more detail with reference to the accompanying drawings.

FIG. 1 is a perspective view illustrating a display device according to an embodiment. FIG. 2 is a developed view illustrating an unfolded state of the display device of FIG. 1.

Referring to FIGS. 1 and 2, a display device 1 may display an image. For example, the display device 1 may be an organic light-emitting diode (OLED) display device, a liquid crystal display (LCD) device, a plasma display (PDP) device, a field emission display (FED) device, an electrophoretic display (EPD) device, or the like. Hereinafter, for convenience, an example in which the display device 1 is an OLED display device will be described in more detail, but the present disclosure is not limited thereto.

The display device 1 may be applied to various suitable portable electronic devices, for example, such as mobile phones, smart phones, tablet personal computers (PCs), smart watches, watch phones, mobile communication terminals, electronic notebooks, electronic books, portable multimedia players (PMPs), navigation systems, and ultra mobile PCs (UMPCs), as well as to a variety of suitable products, for example, such as televisions, laptops, monitors, advertising boards, and Internet of Things devices.

The display device 1 may include a main display surface 10, and sub-display surfaces 11, 12, 13, and 14.

The main display surface 10 may have a generally plate shape, may be located on one surface of the display device 1, and may have the largest area (or the largest size) from among the main display surface 10 and the sub-display surfaces 11 to 14. For example, the main display surface 10 may be located on a top surface of the display device 11. The main display surface 10 may have a polygonal shape, for example, such as a rectangular shape, and/or a planar shape, for example, such as a circular shape or an elliptical shape.

The sub-display surfaces 11 to 14 may be located on surfaces that are different from the surface on which the main display surface 10 is located. Each of the sub-display surfaces 11 to 14 may have an area that is smaller than an area of the main display surface 10, and the sub-display surfaces 11 to 14 may be located on different surfaces from each other. Each of the sub-display surfaces 11 to 14 may be connected to respective sides of the main display surface 10, and may be bent or curved from the main display surface 10 (or from the respective sides of the main display surface 10).

For example, when the main display surface 10 has a rectangular shape, the display device 1 may include first, second, third, and fourth sub-display surfaces 11, 12, 13, and 14, and each of the first to fourth sub-display surfaces 11 to 14 may be connected to one of four sides of the rectangular shape of the main display surface 10.

The first sub-display surface 11 may be connected to a first long side of the main display surface 10, and may be bent from the main display surface 10 in a vertical direction to form a left side surface of the display device 1. Similarly, the second sub-display surface 12 may be connected to a second long side of the main display surface 10, and may be bent from the main display surface 10 in the vertical direction to form a right side surface of the display device 1. The third sub-display surface 13 may be connected to a first short side of the main display surface 10 to form an upper side surface of the display device 1, and the fourth sub-display surface 14 may be connected to a second short side of the main display surface 10 to form a lower side surface of the display device 1.

In this case, the display device 1 may be a three-dimensional multi-surface display device, which displays a screen on a top surface thereof, and on side surfaces thereof connected to the top surface. Although a bottom surface of the display device 1 has been illustrated in FIG. 2 as not including a display surface, this is merely illustrative and the present disclosure is not limited thereto. For example, in some embodiments, the display device 1 may further include a bottom surface for displaying an image.

The display device 1 may include a display area DA, and a non-display area NDA. The display area DA may be an area at (e.g., in or on) which an image is displayed, and may include pixels PX that are light-emitting units as basic units to display an image. The non-display area may be an area at (e.g., in or on) which an image is not displayed, and may not include the pixels PX. The pixels PX will be described in more detail below with reference to FIG. 6.

The display area DA may include a main display area DA0, and first to fourth sub-display areas DA1, DA2, DA3, and DA4.

The main display area DA0 may be located on the main display surface 10. For example, the main display surface 10 may include only the main display area DA0. The first display area DA1 may be located on the first sub-display surface 11, and connected to the main display area DA. Similarly, the second to fourth display areas DA2 to DA4 may be located on the second to fourth sub-display surfaces 12 to 14, respectively, and each of the second to fourth display areas DA2 to DA4 may be connected to the main display area DA0.

In the developed view of the display device 1 shown in FIG. 2, the non-display area NDA may be disposed along an edge of the display area DA (or along outermost edges of entireties of the main display surface 10 and the sub-display surfaces 11 to 14). Drive lines and drive circuits may be disposed at (e.g., in or on) the non-display area NDA. The non-display area NDA may include a black matrix, which blocks or substantially blocks leakage light, a decoration ink, and/or the like, but the present disclosure is not limited thereto.

The non-display area NDA may include first to fourth non-display areas (or first to fourth sub non-display areas) NDA1, NDA2, NDA3, and NDA4. The first non-display area NDA1 may be located on the first sub-display surface 11. Similarly, the second to fourth non-display areas NDA2 to NDA4 may be located on the second to fourth sub-display surfaces 12 to 14, respectively.

In one or more embodiments, the non-display area NDA (or the display device 1) may include first to fourth corner wings (or corners, corner areas, or corner wing areas) 21, 22, 23, and 24. Each of the first to fourth corner wings 21 to 24 may be disposed to be adjacent to a corner of the main display surface 11 (e.g., at (e.g., in or on) a portion where two sides thereof meet). The first to fourth corner wings 21 to 24 may be the same or substantially the same as (or substantially identical to) each other except for their positions. Hereinafter, common features of the first to fourth corner wings 21 to 24 will be described in more detail based on the first corner wing 21, and redundant description corresponding to the second to fourth corner wings 22 to 24 may not be repeated.

The first corner wing 21 may have a shape protruding outward from a corner of the main display surface 10. The first corner wing 21 may be located between the first sub-display surface 11 and the fourth sub-display surface 14 (or between the first sub-display area DA1 and the fourth sub-display area DA4, or between the first non-display area NDA1 and the fourth non-display area NDA4). The first corner wing 21 may alleviate an intersection angle between the first sub-display surface 11 and the fourth sub-display surface 14 with an obtuse angle. One end of the first corner wing 21 may be located at (e.g., in or on) the first sub-display surface 11, and another end (e.g., an opposite end) thereof may be located at (e.g., in or on) the fourth sub-display surface 14.

The first corner wing 21 may provide a space at (e.g., in or on) which signal lines are disposed, or through which the signal lines pass. When the first sub-display surface 11 and the fourth sub-display surface 14 are bent, the first corner wing 21 may be folded inward (e.g., in a direction toward an inner space or the center of gravity of the display device 1). In this case, the first corner wing 21 is bent along a bending line 20, such that one end of the first corner wing 21 (e.g., a first portion thereof adjacent to the first sub-display surface 11) and another end thereof (e.g., a second portion thereof adjacent to the fourth sub-display surface 14) may face each other. The one end and the other end of the first corner wing 21 may be brought into contact with each other, or may be connected to each other through a bonding layer.

Because the first corner wing 21 is folded inward when the first sub-display surface 11 and the fourth sub-display surface 14 are bent, the first corner wing 21 may not be exposed to the outside. Similarly, the second corner wing 22, the third corner wing 23, and the fourth corner wing 24 may not be exposed to the outside. Consequently, the first to fourth corner wings 21 to 24 may be included at (e.g., in or on) the non-display area NDA.

The non-display area NDA (or the display device 1) may further include a drive area 30, and the drive area 30 may be connected to at least one sub-display surface from among the first to fourth sub-display surfaces 11 to 14. For example, the drive area 30 may be connected to one side (e.g., one end) of the fourth sub-display surface 14 (e.g., a bottom side or a bottom end of the fourth sub-display surface 14 in the developed view of the display device 1 shown in FIG. 2).

As shown in FIG. 1, when the fourth sub-display surface 14 is vertically bent based on the main display surface 10, the drive area 30 may be vertically bent again based on the fourth sub-display surface 14 (or in other words, may be bent at an angle of 180° based on the main display surface 10) to be disposed below the main display surface 10 in a thickness direction of the main display surface 10. The drive area 30 may overlap with the main display surface 10, and may be parallel or substantially parallel thereto.

The display device 1 may include a driving chip 40 (or a pad portion on which a driving chip is disposed and which is electrically connected to the driving chip), and the driving chip 40 may be disposed at (e.g., in or on) the drive area 30. The driving chip 40 may generate a drive signal that is used to drive the pixel PX, and may provide the drive signal to the display area DA (e.g., to the pixel PX). For example, the driving chip 40 may generate a data signal, which determines light emission brightness of the pixel PX. In this case, the driving chip 40 may provide a data signal to the pixel PX through a drive line formed at (e.g., in or on) the drive area 30, and a signal line (e.g., a data line) formed at (e.g., in or on) the main display surface 10 and the sub-display surfaces 11 to 14.

Hereinafter, a signal line for transmitting a drive signal will be described in more detail.

FIG. 3 is a plan view illustrating an example of the display device of FIG. 1. FIG. 4 is an enlarged view illustrating the area A of FIG. 3. FIG. 5 is an enlarged view illustrating the area B of FIG. 3.

Referring to FIGS. 1 to 5, the display device 1 may include a signal line 136, a connection line 146, and a drive line 60. An arrangement configuration of the signal line 136, the connection line 146, and the drive line 60 may extend in a first direction W1, and may be symmetrical to one another based on a reference axis (not shown) passing through a center of the area of the display device 1. Hereinafter, a signal line 136, a connection line 146, and a drive line 60 that are relatively adjacent to the first sub-display surface 11 will be mainly described in more detail.

The signal line 136 may include data lines D1 to Dm (or a plurality of signal lines), where m is an integer that is greater than or equal to three.

The data lines D1 to Dm may extend in the first direction W1, and may be sequentially arranged at suitable intervals (e.g., at predetermined or specific intervals) along a second direction W2 crossing the first direction W1. Each of the data lines D1 to Dm may extend to cross (e.g., may extend across) the display area DA in the first direction W1. For example, first to $k^{th}$ data lines from among the data lines D1 to Dm may be disposed at (e.g., in or on) only one display surface from among the main display surface 10 and the first to fourth sub-display surfaces 11 to 14, where k is a positive integer that is greater than or equal to two and less than m). Hereinafter, an example in which k is equal to 7 and m is greater than 14 will be described in more detail.

For example, first to seventh data lines D1 to D7 may extend from one end of the first non-display area NDA1 to another end (e.g., an opposite end) thereof by crossing the first sub-display area DA1 (e.g., from a lower side portion to an upper side portion thereof). Eighth to fourteenth data lines D8 to D14 may extend from the fourth non-display area NDA4 to the third non-display area NDA3 by crossing the fourth sub-display area DA4, the main display area DA0, and the third sub-display area DA3. In addition, some of the data lines D1 to Dm may extend from one corner wing from among the corner wings 21 to 24 to another corner wing from among the corner wings 21 to 24. For example, the third to seventh data lines D3 to D7 may extend from the first corner wing 21 to the third corner wing 23.

The connection line 146 may electrically connect some of the signal lines 136 to some of the drive lines 60. The connection line 146 may be disposed at (e.g., in or on) a layer different from a layer at (e.g., in or on) which the signal line 136 is disposed, and the connection line 146 may be insulated from the signal line 136 through an insulating layer. This will be described in more detail below with reference to FIG. 8.

The connection line 146 may include first to $k^{th}$ data connection lines DM1 to DMk (or first to $k^{th}$ connection lines) corresponding to the first to kit data lines D1 to DK. For example, when k is equal to 7, the connection line 146 may include first to seventh data connection lines DM1 to DM7. The first to seventh data connection lines DM1 to DM7 may correspond to the first to seventh data lines D1 to D7 that are disposed at (e.g., in or on) the first sub-display surface 11, respectively.

The first to seventh data connection lines DM1 to DM7 may extend from the fourth non-display area NDA4 of the fourth sub-display surface 14 (e.g., a lower portion of the fourth non-display area NDA4) to one end of a corresponding signal line 136 connected thereto via the display area DA (e.g., a lower portion of the first non-display area NDA1 and the first corner wing 21). The first to seventh data connection lines DM1 to DM7 may be disposed to be spaced apart at a suitable interval (e.g., a predetermined or specific interval) from each other. The intervals between the first to seventh data connection lines DM1 to DM7 may be the same or substantially the same as the intervals between the first to seventh data lines D1 to D7.

As shown in FIGS. 4 and 5, the first to seventh data connection lines DM1 to DM7 may extend from the fourth non-display area NDA4 of the fourth sub-display surface 14 (e.g., the lower portion of the fourth non-display area NDA4) in the first direction W1 (e.g., toward an upper side), may extend by turning (e.g., by being bent) in a direction of the second direction W2 (e.g., toward a left side) at (e.g., in or on) the display area DA, and may extend to one end of the corresponding signal line 136 (e.g., at a lower portion of the first non-display area NDA1 of the first sub-display surface 11) at (e.g., in or on) an area that is adjacent to or intersecting the corresponding signal line 136.

In other words, each of the first to seventh data connection lines DM1 to DM7 may include a first portion extending from the fourth non-display area NDA4 in the first direction W1, a second portion extending from one end of the first portion in the second direction W2, and a third portion extending from one end of the second portion in the first direction W1 (or in a direction opposite to the first direction W1).

As shown in FIG. 4, the first portion of each of the first to seventh data connection lines DM1 to DM7 may overlap with one of the first to mil data lines D1 to Dm at (e.g., in or on) the display area DA when viewed in a plan view (e.g., when viewed from a direction that is perpendicular or substantially perpendicular to a top surface of the relevant element or layer, for example, such as a top surface of the display device 1 or a layer of the data connection lines DM1 to DM7). For example, the first portion of the second data connection line DM2 may overlap with the ninth data line D9, and the first portion of the seventh data connection line DM7 may overlap with the fourteenth data line D14. However, the above description is provided as an illustrative example, and the present disclosure is not limited thereto. For example, in some embodiments, the first portions of the first to seventh data connection lines DM1 to DM7 may not overlap with the corresponding ones of the first to $m^{th}$ data lines D1 to Dm at (e.g., in or on) the display area DA when viewed in the plan view.

In addition, as shown in FIG. 5, the third portion of each of the first to seventh data connection lines DM1 to DM7 may be disposed to overlap with one of the first to mil data lines D1 to Dm when viewed in a plan view. For example, the third portion of the first data connection line DM1 may overlap with the seventh data line D7, and the third portion of the second data connection line DM2 may overlap with the sixth data line D6.

While the connection line 146 is illustrated as being bent at a right angle in FIGS. 4 and 5, the present disclosure is not limited thereto.

When viewed in a plan view, the first to seventh data connection lines DM1 to DM7 may not cross each other, and thus, may be disposed by circumventing other data connection lines which are relatively adjacent to the first corner wing 21. For example, the first data connection line DM1 may be disposed to circumvent the second data connection line DM2. In other words, when the connection line 146 is adjacent to (e.g., closer to) the corner wing (e.g., the first corner wing 21), a bent position of the connection line 146 may be closer to the drive area 30, and when the connection line 146 is away from (e.g., farther from) the corner wing, the bent position of the connection line 146 may be further spaced apart from the drive area 30.

The data connection line, which is relatively spaced apart from the first corner wing 21, is disposed by circumventing other data connection lines which are relatively adjacent to the first corner wing 21, so that the first to seventh data connection lines DM1 to DM7 may have different lengths from each other. For example, the length of the second data connection line DM2 may be longer than the length of the first data connection line DM1. In other words, a length of an $(i+1)^{th}$ data connection line DM (i+1) may be longer than a length of an $i^{th}$ data connection line DMi, where i is a positive integer.

In an embodiment, the first to seventh data connection lines DM1 to DM7 may have the same resistance value as each other. For example, when the length of the second data connection line DM2 is longer than the length of the first data connection line DM1, a width of the first data connection line DM1 may be greater than a width of the second data connection line DM2.

The first to seventh data connection lines DM1 to DM7 may be directly connected one-to-one to corresponding ones of the first to seventh data lines D1 to D7, respectively, through contact holes CNT formed in the lower portion of the first non-display area NDA1 and the first corner wing 21 (e.g., contact holes CNT formed in the non-display area NDA). For example, the first data connection line DM1 may be electrically connected to the seventh data line D7, and the seventh data connection line DM7 may be electrically connected to the first data line D1. In other words, the $i^{th}$ data connection line DMi may be electrically connected to a $(k+1-i)^{th}$ data line DM (k+1−i).

The drive line 60 may include drive lines 61*a* to 67*a* and 61*b* to 67*b* (or pad lines and pad connection lines), and the drive lines 61*a* to 67*a* and 61*b* to 67*b* may extend from the driving chip 40 (or a pad portion on which the driving chip 40 is disposed) to the fourth non-display area NDA4 of the fourth sub-display surface 14 (or a tangent line 51 of the drive area 30 and the sub-display surface 14).

The drive lines 61*a* to 67*a* and 61*b* to 67*b* may be divided into a first drive line group 60*a* and a second drive line group 60*b*. The drive lines 61*a* to 67*a* included in the first drive line group 60*a* may be disposed at (e.g., in or on) a layer that is different from a layer at (e.g., in or on) which the drive lines 61*b* to 67*b* included in the second drive line group 60*b* are disposed. When viewed in a plan view, the drive lines 61*a* to 67*a* included in the first drive line group 60*a* may cross the drive lines 61*b* to 67*b* included in the second drive line group 60*b*. The drive lines 61*a* to 67*a* included in the first drive line group 60*a* may be insulated from the drive lines 61*b* to 67*b* included in the second drive line group 60*b* through a separate insulating layer.

The drive lines 61*a* to 67*a* included in the first drive line group 60*a* may be electrically connected to the data lines D1 to D7 disposed at (e.g., in or on) the first sub-display surface 11 through the data connection lines DM1 to DM7, respectively. The drive lines 61*b* to 67*b* included in the second drive line group 60*b* may be electrically connected to the data lines D8 to D14 disposed at (e.g., in or on) the main display surface 10, respectively.

As described above, the display device 1 may include the connection line 146 disposed via the display area DA, and may provide an image signal from the driving chip 40 to the signal line 136 (for example, the first to seventh data lines D1 to D7) disposed at (e.g., in or on) the first sub-display surface 11 (and the second sub-display surface 12) through the connection line 146. Thus, an additional dead space, which is required to directly connect the signal line 136 disposed on the first sub-display surface 11 (and the second sub-display surface 12) to the drive line 60, may be unnecessary. In other words, an increase in the dead space may be prevented or substantially prevented.

In addition, the contact holes CNT, which electrically connect the signal line 136 to the connection line 146 that are disposed at (e.g., in or on) the first sub-display surface 11 (and the second sub-display surface 12), are formed at (e.g., in or on) the non-display area NDA, so that interference of the contact holes CNT with respect to the pixels PX (or a drive signal provided to the pixels PX) may be eliminated or reduced.

Hereinafter, a configuration of the pixel PX and an influence of the contact hole CNT according to the configuration of the pixel PX will be first described, and then a relationship between the signal line 136, the connection line 146, and the drive line 60 will be described in more detail.

FIG. 6 is a circuit diagram illustrating an example of a pixel included in the display device of FIG. 1. FIG. 7 is a cross-sectional view illustrating an example of the display device taken along the line I-I' of FIG. 4. FIG. 8 is a cross-sectional view illustrating an example of the display device taken along the line II-II' of FIG. 5. FIG. 9 is a cross-sectional view illustrating an example of the display device taken along the line III-III' of FIG. 3.

First, referring to FIG. 6, the pixel PX (or a pixel circuit) may include a light-emitting diode OLED, first to seventh transistors T1 to T7, and a storage capacitor Cst. A data signal DATA, a first scan signal SL1*k*, a second scan signal SL2*k*, a third scan signal SL3*k*, a light emission control signal EM, and an initialization voltage VINT may be applied to the pixel PX. The data signal DATA, the first scan signal SL1*k*, the second scan signal SL2*k*, the third scan signal SL3*k*, the light emission control signal EM, and the initialization voltage VINT may be provided from the driving chip 40, which is described above with reference to FIG. 2.

Each of the first to seventh transistors T1 to T7 may be a thin film transistor. Each of the first to seventh transistors T1 to T7 may be a p-channel metal oxide semiconductor (PMOS) transistor (e.g., a p-channel MOS field effect transistor (FET) (MOSFET)), or an n-channel MOS (NMOS) transistor (e.g., an n-channel MOSFET). In FIG. 6, although the first to seventh transistors T1 to T7 are illustrated as being PMOS transistors, this is provided as an illustrative example, and thus, the present disclosure is not limited thereto. For example, the first to seventh transistors T1 to T7 may be NMOS transistors. As another example, the first, second, fifth, and sixth transistors T1, T2, T5, and T6 may be PMOS transistors, and the third and fourth transistors T3 and T4 may be NMOS transistors.

The first transistor T1 (or a driving transistor) may include a first electrode connected to a first node N1, a second electrode connected to a second node N2, and a gate electrode connected to a third node N3. The first transistor T1 may provide a drive current Ioled to the light-emitting diode OLED on the basis of a voltage at the third node N3 (e.g., on the basis of a data voltage stored in the storage capacitor Cst, which will be described in more detail below).

The second transistor T2 (or a switching transistor) may include a first electrode connected to the data line (or to a line from which the data signal DATA is received), a second electrode connected to the first node N1, and a gate electrode that receives a first scan signal SL1*k* (e.g., that is connected to a first scan line), where k is a positive integer. In response to the first scan signal SL1*k*, the second transistor T2 may be turned on to transmit the data signal DATA to the first node N1.

The third transistor T3 may include a first electrode connected to the second node N2, a second electrode connected to the third node N3, and a gate electrode that receives the first scan signal SL1*k* (e.g., that is connected to the first scan line). In response to the first scan signal SL1*k*, the third transistor T3 may be turned on to transmit the data signal DATA to the third node N3.

The storage capacitor Cst may be connected to (or formed between) the third node N3 and a first power supply voltage ELVDD. The storage capacitor Cst may store the provided data signal DATA.

The fourth transistor T4 may include a first electrode connected to the third node N3, a second electrode that is connected to an initialization voltage line and/or receives the initialization voltage VINT, and a gate electrode that is connected to a second scan line and/or receives the second scan signal SL2*k*. Before the data signal DATA is stored in the storage capacitor Cst, or after the light-emitting diode OLED emits light, the fourth transistor T4 may be turned on in response to the second scan signal SL2*k*, and may initialize the third node N3 (or the storage capacitor Cst) using the initialization voltage VINT.

The fifth transistor T5 and the sixth transistor T6 (or first and second light emission control transistors) may be connected between a first power supply voltage line and the light-emitting diode OLED, and may form a current flow path through which the drive current Ioled generated by the first transistor T1 flows.

The fifth transistor T5 may include a first electrode connected to the first power supply voltage line to receive the first power supply voltage ELVDD, a second electrode connected to the first node N1, and a gate electrode that is connected to a light emission control signal line and/or receives the light emission control signal EM.

Similarly, the sixth transistor T6 may include a first electrode connected to the second node N2, a second electrode connected to a fourth node N4 (or an anode electrode of the light-emitting diode OLED), and a gate electrode that is connected to the light emission control signal line and/or receives the light emission control signal EM.

The fifth and sixth transistors T5 and T6 are turned on in response to the light emission control signal EM. In this case, the drive current Ioled may be provided to the light-emitting diode OLED, and the light-emitting diode OLED may emit light with a brightness corresponding to the drive current Ioled.

The seventh transistor T7 may include a first electrode connected to the fourth node N4, a second electrode that is connected to the initialization voltage line and/or receives the initialization voltage VINT, and a gate electrode that is connected to a third scan line and/or receives the third scan signal SL3*k*.

Before or after the light-emitting diode OLED emits light, the seventh transistor T7 may be turned on in response to the third scan signal SL3*k*, and may initialize the anode electrode of the light-emitting diode OLED using the initialization voltage VINT. The light-emitting diode OLED may have a parasitic capacitor formed between the anode electrode and a cathode electrode (or a second power supply voltage ELVSS), and the parasitic capacitor may be charged while the light-emitting diode OLED emits light so that the anode electrode of the light-emitting diode OLED may have a specific voltage. Thus, the light-emitting diode OLED may be initialized through the seventh transistor T7.

In FIG. 6, although the pixel PX has been illustrated as having a seven transistor-one capacitor (7T1C) structure including the seven transistors T1 to T7 and the one capacitor Cst, this is provided as an illustrative example, and thus, the pixel PX is not limited thereto. For example, in various embodiments, the pixel PX may have various other suitable structures such as a two transistor-one capacitor (2T1C) structure, a five transistor-one capacitor (5T1C) structure, a six transistor-one capacitor (6T1C) structure, and the like.

Each of the gate electrodes of the first to seventh transistors T1 to T7, at least a portion of the scan signal lines for transmitting the scan signals SL1_k_, SL2_k_, and SL3_k_, and the first electrode of the storage capacitor Cst may be formed as first gate conductive layers (or as first conductive layers), which are disposed to be coplanar with each other. In addition, a second electrode of the storage capacitor Cst may be formed as a second gate conductive layer (or as a second conductive layer), which is disposed at (e.g., in or on) a layer that is different from that of the first gate conductive layers.

In addition, each of the data lines and the first and second electrodes (e.g., source electrodes and drain electrodes) of the first to seventh transistors T1 to T7 may be formed as at least one of first source/drain conductive layers (or as third conductive layers) and second source/drain conductive layers (or as fourth conductive layers).

Referring to FIGS. 6 and 7, the display device 1 may include a substrate 101, a buffer layer 102, a semiconductor layer 105, a first insulating layer 171, a first gate conductive layer 110, a second insulating layer 172, a second gate conductive layer 120, a third insulating layer 173, a first source/drain conductive layer 130, a fourth insulating layer 174, a second source/drain conductive layer 140, a fifth insulating layer 175, a first electrode layer 150, a light-emitting element layer, and a second electrode layer 160. The transistors T1 to T7 described with reference to FIG. 6 may be formed on the semiconductor layer 105 or the second gate conductive layer 120. Thus, the semiconductor layer 105 or the second gate conductive layer 120 may be collectively referred to as a driving element layer.

The substrate 101 may support each layer disposed thereon. The substrate 101 may be made of a conductive material. The substrate 101 may be made of an inorganic material, for example, such as glass or quartz, or may be made of an organic material, for example, such as polyimide. The substrate 101 may be a rigid substrate or a flexible substrate.

The buffer layer 102 may be disposed on the substrate 101. The buffer layer 102 may prevent or substantially prevent the diffusion of impurity ions and the infiltration of moisture and/or external air, and may perform a surface planarization function. The buffer layer 102 may include silicon nitride, silicon oxide, silicon oxynitride, or the like. However, the present disclosure is not limited thereto, and the buffer layer 102 may be omitted according to a type of the substrate 101 or process conditions.

The semiconductor layer 105 may be disposed on the buffer layer 102. The semiconductor layer 105 may include first and second semiconductor patterns 105_1 and 105_2, and the first and second semiconductor patterns 105_1 and 105_2 may form channels of the transistors T1 to T7 that are described above with reference to FIG. 6. For example, the first semiconductor pattern 105_1 may constitute the channel of the first transistor T1, and the second semiconductor pattern 105_2 may constitute the channel of the second transistor T2.

The semiconductor layer 105 may include polycrystalline silicon. Portions of the semiconductor layer 105 (e.g., source/drain regions thereof) connected to the source/drain electrodes of the thin film transistors (TFTs) may be doped with an impurity ion (e.g., a p-type impurity ion). A trivalent dopant, for example, such as boron (B) or the like, may be used as the p-type impurity ion. Instead of polycrystalline silicon, the semiconductor layer 105 may include single crystalline silicon, low-temperature polycrystalline silicon, amorphous silicon, or an oxide semiconductor, for example, such as indium tin zinc oxide (ITZO) or indium gallium zinc oxide (IGZO).

The first insulating layer 171 may be disposed on the semiconductor layer 105. The first insulating layer 171 may be a gate insulating layer having a gate insulating function.

The first gate conductive layer 110 may be disposed on the first insulating layer 171. First and second gate conductive patterns 110_1 and 110_2 are disposed in the first gate conductive layer 110. The first and second gate conductive patterns 110_1 and 110_2 may include gate electrodes of the transistors (e.g., the first and second transistors T1 and T2). For example, the first gate conductive pattern 110_1 may include the gate electrode of the first transistor T1, and the second gate conductive pattern 110_2 may include the gate electrode of the second transistor T2. The first gate conductive layer 110 (e.g., the first gate conductive pattern 110_1) may include the first electrode of the storage capacitor Cst.

The first gate conductive layer 110 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 172 may be disposed on the first gate conductive layer 110. The second insulating layer 172 may be an interlayer insulating layer.

The second gate conductive layer 120 may be disposed on the second insulating layer 172. The second gate conductive layer 120 may include a second electrode 121 of the storage capacitor Cst. The second electrode 121 may be disposed to overlap with the first gate conductive pattern 110_1 by interposing the second insulating layer 172 therebetween to form the storage capacitor Cst. The second gate conductive layer 120 may be formed to include one or more materials which are provided as examples of the constituent materials of the first gate conductive layer 110 described above.

The third insulating layer 173 may be disposed on the second gate conductive layer 120.

The first source/drain conductive layer 130 may be disposed on the third insulating layer 173. The first source/drain conductive layer 130 may include the source electrode 132 and the drain electrode 131 of the second transistor T2, a first data pattern 133, the source electrode 134 and the drain electrode 135 of the first transistor T1, a signal line 136 (or in other words, the signal line 136 that is described above with reference to FIG. 3), and the first power supply line 137. The first data pattern 133 may be electrically connected to the first gate conductive pattern 110_1 through a contact hole passing through (e.g., penetrating) the second insulating layer 172 and the third insulating layer 173 to expose the first gate conductive pattern 110_1. The first data pattern 133 may correspond to the third node N3 shown in FIG. 6.

The first source/drain conductive layer 130 may include one or more metals selected from among Mo, Al, Pt, Pd, Ag, Mg, Au, Ni, Nd, Ir, Cr, Ca, Ti, Ta, W, and Cu. The first source/drain conductive layer 130 may be a single layer or multilayers. For example, the first source/drain conductive layer 130 may be formed in a stacked structure of Ti/Al/Ti, Mo/Al/Mo, Mo/AlGe/Mo, Ti/Cu, or the like.

The fourth insulating layer 174 may be disposed on the first source/drain conductive layer 130, and the second source/drain conductive layer 140 may be disposed on the fourth insulating layer 174.

The second source/drain conductive layer 140 may include a connection line 146 (or in other words, the connection line 146 that is described above with reference to FIG. 3). The connection line 146 may be disposed to overlap with the signal line 136 when viewed in a plan view. The second source/drain conductive layer 140 may include a metal from among the one or more metals constituting the first source/drain conductive layer 130 described above.

The fifth insulating layer 175 may be disposed on the second source/drain conductive layer 140, and the first electrode layer 150 may be disposed on the fifth insulating layer 175. The first electrode layer 150 may include an anode electrode 151 of the light-emitting diode OLED, and the anode electrode 151 may be electrically connected to the source electrode 134 of the first transistor T1 (or the second electrode of the sixth transistor T6 which is described above with reference to FIG. 4) through a contact hole passing through (e.g., penetrating) the fifth insulating layer 175 and the fourth insulating layer 174.

The light-emitting element layer may be disposed on the first electrode layer 150, and the light-emitting element layer may include a pixel defining layer 176 and an organic layer EL. The pixel defining layer 176 may be disposed on the anode electrode 151 along an edge thereof, and may include an opening exposing the anode electrode 151.

The organic layer EL may be disposed in the opening of the pixel defining layer 176. The organic layer EL may include an organic light emission layer, a hole injection/transport layer, and an electron injection/transport layer. The second electrode layer 160 (or the cathode electrode of the light-emitting diode OLED) may be disposed on the organic layer EL and the pixel defining layer 176. The second electrode layer 160 may be a common electrode that is disposed over the entirety of the display area DA of the display device 1.

As shown in FIGS. 6 and 7, a parasitic capacitor Cpara may be formed between the data line 136 (and the connection line 146) and the third node N3 (or the first data pattern 133 connected to the gate electrode of the first transistor T1).

For example, a first parasitic capacitor $C_1$ may be formed between the data line 136 and the third node N3 (or the first data pattern 133). However, because the capacitance of the first parasitic capacitor $C_1$ is insignificant and also equally or similarly acts on all pixels of the display area DA, degradation of the display quality due to the first parasitic capacitor $C_1$ may be negligible or may not be considered.

In addition, the connection line 146 is disposed adjacent to the pixel PX so that a second parasitic capacitor $C_2$ may be formed between the connection line 146 and the third node N3. When the connection line 146 has the same or substantially the same specifications (for example, a thickness, an area, a length, and the like) as those of the signal line 136, and is disposed to overlap with the signal line 136, the capacitance of the second parasitic capacitor $C_2$ may be smaller than the capacitance of the first parasitic capacitor $C_1$, and degradation of the display quality due to the second parasitic capacitor $C_2$ may be negligible or may not be considered.

However, when a contact hole CNT_C for electrically connecting the signal line 136 to the connection line 146 is present in the display area DA, a third parasitic capacitor $C_3$ may be formed between the contact hole CNT_C and the third node N3. Because a length of the contact hole CNT_C in a thickness direction acts as an area component of the third parasitic capacitor $C_3$, the capacitance of the third parasitic capacitor $C_3$ may be relatively greater than the capacitance of the first parasitic capacitor $C_1$, and thus, the display quality may be degraded due to the third parasitic capacitor $C_3$. For example, a delay and a variation may occur in the transmission/recording of a drive signal of a pixel PX adjacent to the contact hole CNT_C, so that the corresponding pixel PX may not emit light with a desired brightness, and thus, a phenomenon in which stripes or spots are displayed on a display image may occur.

Consequently, as shown in FIGS. 3 and 5, the display device 1 according to one or more embodiments of the present disclosure may include the contact hole CNT formed at (e.g., in or on) the non-display area NDA instead of the display area DA, and the signal line 136 and the connection line 146 may be connected to each other through the contact hole CNT at (e.g., in or on) the non-display area NDA. Therefore, degradation of the display quality due to the contact hole CNT may be prevented or reduced.

As shown in FIG. 8, the sixth data line D6 may be disposed at (e.g., in or on) the first source/drain conductive layer 130, the second, third, and fourth data connection lines DM2, DM3, and DM4 may be disposed at (e.g., in or on) the second source/drain conductive layer 140, and the third and fourth data connection lines DM3 and DM4 may be insulated from the sixth data line D6 through the fourth insulating layer 174. The second data connection line DM2 may extend to one end of the sixth data line D6, and may be electrically connected to the sixth data line D6 through a contact hole CNT which passes through (e.g., which penetrates) the fourth insulating layer 174 to expose the one end of the sixth data line D6.

Referring to FIG. 9, the drive lines included in the first drive line group **60*a* (e.g., the drive lines connected to the connection line 146) may be disposed at (e.g., in or on) the second gate conductive layer 120, and the drive lines included in the second drive line group 60*b* (e.g., the drive lines directly connected to the data lines) may be disposed at (e.g., in or on) the first gate conductive layer 110**.

The first power supply line 137 (or a line which transmits the second power supply voltage ELVSS) may be disposed between the third insulating layer 173 and the fourth insulating layer 174. As shown in FIG. 9, the first power supply line 137 may be disposed over the entirety or substantially the entirety of the drive area 30. The data connection line 146, as described above with reference to FIG. 7, may be disposed on the fifth insulating layer 175. Because the data connection line 146 and the drive lines **60*a* and 60*b* are spaced apart from each other, and the power supply line 137** is disposed therebetween, signal interference between the lines may be blocked or reduced.

As described with reference to FIGS. 6 to 9, the connection line 146 is disposed to be spaced apart from the gate electrode of the first transistor T1 (and the second to seventh transistors T2 to T7), and is also disposed to be further away from the signal line 136, so that the capacitance of the second parasitic capacitor $C_2$ formed between the first connection line 146 and the gate electrode of the first transistor T1 may be reduced, and the degradation of the display quality due to the second parasitic capacitor $C_2$ may be reduced.

In addition, because the contact hole CNT connecting the connection line 146 to the signal line 136 is formed at (e.g., in or on) the non-display area NDA instead of the display area DA, the degradation of the display quality due to the contact hole CNT may be prevented or substantially prevented.

In addition, the drive lines included in the first drive line group 60*a* and the drive lines included in the second drive line group 60*b* are disposed at (e.g., in or on) different layers from each other to be spaced apart from each other, and the first power supply line 137 (or the second power line which transmits the second power supply voltage ELVSS) is disposed between the connection line 136 and the drive lines so that signal interference between the drive lines and the connection line 136 may be prevented or reduced, and degradation of display quality may be prevented or substantially prevented.

FIG. 10 is a cross-sectional view illustrating another example of the display device taken along the line III-III' of FIG. 3.

Referring to FIGS. 3, 9, and 10, a display device 1_1 of FIG. 10 may be different from the display device 1 of FIG. 9, in that the display device 1_1 of FIG. 10 includes a connection line 146_1 and a first power supply line 137_1 that are disposed at (e.g., in or on) different layers from those of FIG. 9.

The connection line 146_1 may be disposed at (e.g., in or on) the first source/drain conductive layer 130, and the first power supply line 137_1 (or the second power supply line which transmits the second power supply voltage ELVSS) may be disposed at (e.g., in or on) the second source/drain conductive layer 140.

The connection line 146_1 is disposed on the third insulating layer 173, and a voltage line (e.g., ELVDD or ELVSS) is disposed on the fifth insulating layer 175, such that a separation structure (or in other words, the fifth insulating layer 175) is formed on the connection line 146_1, and thus, signal interference on the connection line 146_1 may be blocked or reduced.

FIG. 11 is a cross-sectional view illustrating another example of the display device taken along the line I-I' of FIG. 4.

Referring to FIGS. 3, 7, and 11, a display device 1_2 of FIG. 11 may be different from the display device 1 of FIG. 7, in that the display device 1_2 of FIG. 11 includes a sixth insulating layer 175_2 and a connection line 146_2. The display device 1_2 is the same or substantially the same as (or similar to) the display device 1 of FIG. 7, except for the sixth insulating layer 175_2 and a location of the connection line 146_2, and thus, redundant description thereof may not be repeated.

The sixth insulating layer 175_2 may be disposed between the fifth insulating layer 175 and the anode electrode 151. The sixth insulating layer 175_2 and the fifth insulating layer 175 may be formed as via layers. The fifth insulating layer 175 and the sixth insulating layer 175_2 are disposed between the connection line 146 and the signal line 136 so that the connection line 146 may be further spaced apart from the signal line 136 and the first data pattern 133.

In addition, the connection line 146_2 may be disposed on the fifth insulating layer 175. In addition, the connection line 146_2 may be disposed to overlap with the first power supply line 137 instead of the data pattern 133.

Consequently, signal interference of the connection line 146_2 with respect to the signal line 136, and signal interference of the connection line 146 with respect to the first data pattern 133, may be further reduced, and degradation of the display quality may be further reduced or prevented.

FIGS. 12 and 13 are diagrams illustrating an example of a connection relationship between connection lines and a driving chip of the display device of FIG. 1.

Referring to FIGS. 1 to 3, 12, and 13, the signal line 136 may include first to $k^{th}$ data lines D1 to Dk (here, k is an integer greater than or equal to two), $(k+1)^{th}$ to $j^{th}$ data lines D(k+1) to Dj (here, j is an integer that is greater than k), and $(j+1)^{th}$ to $m^{th}$ data lines D (+1) to Dm (here, m is an integer that is greater than j), which are sequentially arranged along the second direction W2.

The connection line 146 may include first to $k^{th}$ data connection lines DM1 to DMk which are disposed at (e.g., in or on) the first sub-display surface 11 to correspond to the first to $k^{th}$ data lines D1 to Dk, and $(j+1)^{th}$ to $m^{th}$ data connection lines DM(j+1) to DMm which are disposed at (e.g., in or on) the second sub-display surface 12.

The driving chip 40 may include m output terminals, which are sequentially arranged along the second direction W2. The m output terminals may be divided into a first terminal group K, a second terminal group J, and a third terminal group M along the second direction W2. When terminal numbers are assigned to the m output terminals on the basis of the data lines D1 to Dm corresponding to the m output terminals (or the data lines D1 to Dm electrically connected to the m output terminals in one-to-one correspondence relationship), the terminal numbers (e.g., ranging from 1 to k) may be increased in the first terminal group K in a third direction W3 (e.g., a direction opposite to the second direction W2), the terminal numbers (e.g., ranging from (k+1) to j) may be increased in the second terminal group J in the second direction W2, and the terminal numbers (e.g., ranging from (j+1) to m) may be increased in the third terminal group M in the third direction W3.

In other words, the order of the terminal numbers included in the first and third terminal groups K and M that are connected to the signal line 136 through the connection line 146 may be opposite to the order of the terminal numbers included in the second terminal group J.

When the driving chip 40 sequentially outputs data signals corresponding to general image data through the output terminals in the second direction W2, an image displayed through the first sub-display surface 11 and the second sub-display surface 12 may be inverted in a left-right direction, or may be discontinuous from an image displayed on the main display surface 10.

Thus, when the driving chip 40 generates data signals corresponding to the data lines D1 to Dm on the basis of the image data, the driving chip 40 may generate the data signals by inverting partial images corresponding to the first and second sub-display surfaces 11 and 12 in advance, or may output the data signals in a reverse order to the output terminals included in the first and third terminal groups K and M (or in other words, may output the data signals in a reverse order of the output order of the data signals for the output terminals included in the second terminal group J).

FIG. 14 is a plan view illustrating another example of the display device of FIG. 1.

Referring to FIGS. 1 to 3, and 14, a display device 1_3 may be different from the display device 1 of FIG. 3, in that the display device 1_3 of FIG. 14 includes a connection line 146_1 that is different from that of FIG. 3. The display device 1_3 of FIG. 14 is the same or substantially the same as (or similar to) the display device 1 of FIG. 3, except for the connection line 146_1, and thus, redundant description thereof may not be repeated.

The connection line 146_1 may be different from the connection line 146 described with reference to FIG. 3, in that the connection line 146_1 includes first to fifth data connection lines DM1_1 to DM5_1 (or the first to $k^{th}$ data connection lines).

The first to seventh data connection lines DM1 to DM7 described above with reference to FIG. 3 extend, with a relatively short length, from the fourth non-display area NDA4 of the fourth sub-display surface 14 to the lower portion of the first non-display area NDA1 of the first sub-display surface 11 that is adjacent to the fourth non-display area NDA4. However, the first to fifth data connection lines DM1_1 to DM5_1 may extend, with a relatively long length (e.g., a length that is similar to a length of the signal line 136), from the fourth non-display area NDA4 of the fourth sub-display surface 14 to the upper portion of the first non-display area NDA1 of the first sub-display surface 11, which is spaced apart from the fourth non-display area NDA4.

In other words, instead of simply passing through the display area DA, the first to fifth data connection lines DM1_1 to DM5_1 may be disposed to cross the display area DA (e.g., to cross the main display area DA0).

The first to fifth data connection lines DM1_1 to DM5_1 may be connected to the first to fifth data lines D1 to D5 in a one-to-one manner through the contact holes CNT formed in the upper portion of the first non-display area NDA1.

In this case, even when the driving chip 40 described above with reference to FIG. 14 sequentially outputs the data signals corresponding to the data lines through the output terminals in the second direction W2, a partial image on the first sub-display surface 11 (and the second sub-display surface 12) may not be inverted.

In an embodiment, a width of each of the first to fifth data connection lines DM1_1 to DM5_1 (or in other words, a width in a direction that is perpendicular to or substantially perpendicular to the direction in which the first to fifth data connection lines DM1_1 to DM5_1 extend) may be greater than a width of the signal line 136. In this case, a resistance value of each of the first to fifth data connection lines DM_1 to DM5_1 may be reduced, and attenuation and/or distortion of the data signals for the first to fifth data lines D1 to D5 may be reduced.

As described above with reference to FIG. 14, because the connection line 146_1 crosses the display area DA to be connected to the signal line 136 at (e.g., in or on) the non-display area NDA, a desired image may be displayed without changing an output order of the data signals.

In addition, because the connection line 146_1 has a width that is greater than the width of the signal line 136, degradation of the display quality due to attenuation and/or distortion of the data signals may be alleviated.

FIG. 15 is a plan view illustrating another example of the display device of FIG. 1. FIG. 16 is an enlarged view illustrating the area D of FIG. 15. FIG. 17 is a cross-sectional view illustrating an example of the display device taken along the lines IV-IV' and V-V of FIG. 16.

Referring to FIGS. 1 to 3 and 15 to 17, a display device 1_4 may be different from the display device 1 of FIG. 3, in that the display device 1_4 includes a signal line 136_2, a connection line 146_2, and a drive line 60_1, which may be different from those of the display device 1 of FIG. 3.

The signal line 136_2 may be the same or substantially the same as (or similar to) the signal line 136 described above with reference to FIG. 3, except for the number of data lines D1_2 to D8_2 included in the signal line 136_2. In addition, the connection line 146_2 may be the same or substantially the same as (or similar to) the signal line 146 described above with reference to FIG. 3, except for the number of data connection lines DM1_2 to DM4_2 included in the connection line 146_2. Therefore, redundant descriptions thereof may not be repeated.

As shown in FIG. 16, the data connection lines DM1_2 to DM4_2 may be disposed to extend to the drive area 30. When the drive area 30 is divided into a first drive area 31 that is adjacent to the fourth sub-display surface 14 (or the display area DA), and a second drive area 32 that is spaced apart from the fourth sub-display surface 14 and at (e.g., in or on) which the driving chip 40 is disposed, the data connection lines DM1_2 to DM4_2 may be disposed to extend to the first drive area 31.

Each of the data connection lines DM1_2 to DM4_2 may extend from one end of the first portion, which extends in the first direction W1, in a first diagonal direction DD1 (or in other words, a direction that crosses the first direction W1, and is directed to an area center of the drive area 30 relative to the first direction W1). In addition, at (e.g., in or on) the first drive area 31, the data connection lines DM1_2 to DM4_2 may have different lengths from each other. For example, an end portion of the first data connection line DM1_2 may be relatively adjacent (e.g., may be relatively closer) to the second drive area 32, and an end portion of the fourth data connection line DM4_2 may be relatively spaced apart (e.g., may be relatively farther) from the second drive area 32 and may be adjacent to (e.g., may be closer to) the fourth sub-display surface 14. The end portions of the first to fourth data connection lines DM1_2 to DM4_2 may be sequentially located at (e.g., in or on) the first drive area 31 in a second diagonal direction DD2. Consequently, the connection line 146_2 may be cross-connected to the drive line 60_1, which will be described in more detail below, or the data connection lines DM1_2 to DM4_2 may be connected to connection lines 61*a*_1 to 64*a*_1 in reverse order (e.g., in a reverse order of an arrangement order of the data connection lines DM1_2 to DM4_2).

The drive line 60_1 may include the drive lines 61*a*_1 to 64*a*_1 and drive lines 61*b*_1 to 64*b*_1. First to fourth drive lines 61*a*_1 to 64*a*_1 may be included in the first drive line group 60*a*_1, and fifth to eighth drive lines 61*b*_1 to 64*b*_1 may be included in the second drive line group 60*b*_1.

As described above with reference to FIG. 3, the first to fourth drive lines 61*a*_1 to 64*a*_1 included in the first drive line group 60*a*_1 may be connected to the first to fourth data connection lines DM1_2 to DM4_2, and the fifth to eighth drive lines 61*b*_1 to 64*b*_1 included in the second drive line group 60*b*_1 may be electrically connected to the fifth to eighth data lines D5_2 to D8_2.

The fifth to eighth drive lines 61*b*_1 to 64*b*_1 included in the second drive line group 60*b*_1 may be connected to the fifth to eighth data lines D5_2 to D8_2 in order (e.g., corresponding to the same line number). However, the first to fourth drive lines 61*a*_1 to 64*a*_1 included in the first drive line group 60*a*_1 may be connected to the first to fourth data connection lines DM1_2 to DM4_2 in reverse order. For example, the first drive line 61*a*_1 may be connected to the fourth data connection line DM4_2, and the fourth drive line 64*a*_1 may be connected to the first data connection line DM1_2.

The first drive line 61*a*_1 may extend or substantially extend from the driving chip 40 in the first direction W1, may extend by turning (e.g., by being bent) in a direction of the second direction W2 at (e.g., in or on) the first drive area 31, and may be connected to the fourth data connection line DM4_2 through a contact hole. Similarly, the second drive line 62_a__1 may extend or substantially extend from the driving chip 40 in the first direction W1, may extend by turning (e.g., by being bent) in a direction of the second direction W2 at (e.g., in or on) the first drive area 31, and may be connected to the third data connection line DM3_2 through a contact hole.

The fifth to eighth drive lines 61_b__1 to 64_b__1 may extend or substantially extend at (e.g., in or on) the first drive area 31 in the first direction W1, and may extend or substantially extend to the driving chip 40 at (e.g., in or on) the second drive area 32 in the first diagonal direction DD1.

As shown in FIG. 17, the eighth drive line 64_b__1 (or the fifth to eighth drive lines 61_b__1 to 64_b__1 included in the second drive line group 60_b__1) may be disposed on the first insulating layer 171, which is described above with reference to FIG. 7, or at (e.g., in or on) the first gate conductive layer 110. The first drive line 61_a__1 (or the first to fourth drive lines 61_a__1 to 64_a__1 included in the first drive line group 60_a__1) may be disposed on the second insulating layer 172 or at (e.g., in or on) the second gate conductive layer 120. The eighth data line D8_2 (or the signal line 136_2) may be disposed on the third insulating layer 173 or at (e.g., in or on) the first source/drain conductive layer 130, and the fourth data connection line DM4_2 (or the connection line 146_2) may be disposed on the fourth insulating layer 174 or at (e.g., in or on) the second source/drain conductive layer 140.

The eighth data line D8_2 may be electrically connected to the eighth drive line 64_b__1 through a contact hole, which passes through (e.g., which penetrates) the second and third insulating layers 172 and 173 at an end portion of the eighth data line D8_2 to expose the eighth drive line 64_b__1. Similarly, the fourth data connection line DM4_2 may be electrically connected to the first drive line 61_a__1 through a contact hole, which passes through (e.g., which penetrates) the third and fourth insulating layers 173 and 174 at an end portion of the fourth data connection line DM4_2 to expose the first drive line 61_a__1.

In other words, the second drive line group 60_b__1, the first drive line group 60_a__1, the signal line 136_2, and the connection line 146_2 may be disposed at (e.g., in or on) different layers from each other, may be mutually insulated through the insulating layers 172 to 174 interposed therebetween, and may be connected to corresponding lines through the contact holes.

As described with reference to FIGS. 15 to 17, the display device 1_4 may include the drive lines 61_a__1 to 64_a__1 connected to the data connection lines DM1_1 to DM4_2 in a reverse order (or in other words, in a reverse arrangement order of the arrangement order of the lines). Consequently, a desired image may be displayed without changing an output order of the data signals.

While the signal line 136_2 has been illustrated in FIG. 17 as not overlapping with the connection line 146_2 at (e.g., in or on) the display area DA, this is provided as an illustrative example so as to distinguish the signal line 136_2 from the connection line 146_2, but the present disclosure is not limited thereto. For example, in some embodiments, the signal line 136_2 may overlap with the connection line 146_2 at (e.g., in or on) the display area DA.

In addition, although the second drive line group 60_b__1, the first drive line group 60_a__1, the signal line 136_2, and the connection line 146_2 have been described with reference to FIG. 17 as being sequentially disposed in an upward direction, the present disclosure is not limited thereto. For example, the first drive line group 60_a__1 may be disposed to be further downward than the second drive line group 60_b__1.

Although some example embodiments have been described, those skilled in the art will readily appreciate that various modifications are possible in the example embodiments without departing from the spirit and scope of the present disclosure. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

The invention claimed is:

1. A display device comprising:

a substrate comprising a display area comprising a plurality of pixels, and a non-display area at an outer periphery of the display area, the non-display area comprising a first non-display area and a second non-display area;

a plurality of signal lines extending from the non-display area in a first direction at the display area on the substrate; and at least one connection line extending from the first non-display area to the second non-display area by passing through the display area on the substrate, wherein the at least one connection line is connected to any one signal line from among the plurality of signal lines at the second non-display area, and wherein at least a portion of the at least one connection line extends in a second direction crossing the first direction at the display area to overlap with at least one of the plurality of signal lines extending in the first direction at the display area.

2. The display device of claim 1, wherein:

the at least one connection line comprises a plurality of connection lines; and the plurality of connection lines have different lengths from one another.

3. The display device of claim 2, wherein:

the second non-display area is adjacent to the first non-display area; and a length of a first connection line from among the plurality of connection lines is longer than a length of a second connection line from among the plurality of connection lines.

4. The display device of claim 2, wherein the plurality of connection lines are spaced from each other, and do not cross each other at the display area.

5. The display device of claim 1, wherein:

the at least one connection line comprises a first portion extending in the first direction; and the first portion overlaps with one signal line from among the signal lines in a thickness direction of the substrate.

6. The display device of claim 5, wherein the at least one connection line further comprises a second portion extending from one end of the first portion in the second direction, the second portion including the portion of the at least one connection line overlapping with the at least one of the plurality of signal lines at the display area.

7. The display device of claim 6, wherein:

the at least one connection line further comprises a third portion extending from one end of the second portion in the first direction; and the third portion is spaced from the first portion.

8. The display device of claim 1, wherein:

the first non-display area comprises a corner protruding from an edge of the display area;

one end of a first signal line from among the signal lines is located at the corner;

a second signal line from among the signal lines is spaced from the corner; and the first signal line is longer than the second signal line.

9. The display device of claim 1, further comprising an insulating layer configured to insulate between the at least one connection line and the signal lines, wherein the second non-display area has a contact hole penetrating the insulating layer to expose the any one signal line from among the signal lines, and the at least one connection line is directly connected to the any one signal line from among the signal lines through the contact hole.

10. The display device of claim 1, further comprising a plurality of drive lines sequentially located along the second direction on a drive area of the substrate, wherein the drive area is adjacent to the first non-display area, and is spaced from the display area, at least one drive line from among the drive lines is directly connected to the at least one connection line, and other remaining drive lines from among the drive lines are directly connected to at least one of the signal lines.

11. The display device of claim 10, further comprising:

a first insulating layer and a second insulating layer sequentially located between the at least one drive line and the other remaining drive lines; and a power supply voltage line between the first insulating layer and the second insulating layer.

12. The display device of claim 10, further comprising:

an insulating layer on the drive lines on the substrate; and a power supply voltage line on the insulating layer.

13. The display device of claim 1, further comprising power supply voltage lines between the signal lines on the substrate, wherein the power supply voltage lines are electrically connected to each other, wherein the at least one connection line comprises a first portion extending in the first direction, and wherein the first portion overlaps with one power supply voltage line from among the power supply voltage lines in a thickness direction of the substrate.

14. The display device of claim 1, wherein the at least one connection line comprises a plurality of connection lines, and wherein the plurality of connection lines have the same length as each other.

15. The display device of claim 14, wherein:

the second non-display area is spaced from the first non-display area; and the plurality of connection lines extend across the display area.

16. The display device of claim 1, further comprising a plurality of drive lines sequentially located along the second direction on a drive area of the substrate, wherein the drive area is adjacent to the first non-display area, is spaced from the display area, and comprises pads connected to external devices, wherein at least one drive line from among the drive lines is directly connected to the at least one connection line, and wherein other remaining drive lines from among the drive lines are directly connected to at least one of the signal lines.

17. The display device of claim 16, wherein:

the at least one drive line is at a layer different from a layer of the other remaining drive lines to be insulated from the other remaining drive lines; and the at least one drive line is electrically connected to the at least one connection line through a contact hole in the drive area.

18. A display device, comprising:

a substrate;

a display area comprising a plurality of pixels;

a non-display area at an outer periphery of the display area;

a driving element layer on the substrate, and comprising a transistor at the display area;

a first insulating layer on the driving element layer;

a first conductive layer on the first insulating layer, and comprising a signal line electrically connected to a first electrode of the transistor;

a second insulating layer on the first conductive layer; and a second conductive layer on the second insulating layer, and comprising a connection line electrically connected to the signal line, wherein the signal line and the connection line are each disposed at both the display area and the non-display area, and wherein the connection line is directly connected to the signal line through a contact hole penetrating the second insulating layer at the non-display area.

19. A display device, comprising:

a substrate;

a display area;

a non-display area;

a driving element layer on the substrate, and comprising a transistor at the display area;

a first insulating layer on the driving element layer;

a first conductive layer on the first insulating layer, and comprising a signal line extending in a first direction, and electrically connected to a first electrode of the transistor;

a second insulating layer on the first conductive layer; and a second conductive layer on the second insulating layer, and comprising a connection line electrically connected to the signal line, wherein a portion of the connection line extending in the first direction is directly connected to the signal line through a contact hole penetrating the second insulating layer at the non-display area, and wherein the portion of the connection line extending in the first direction extends to the display area to overlap with the signal line at the display area.

20. The display device of claim 18, wherein:

the first conductive layer further comprises a first power supply voltage line electrically connected to a second electrode of the transistor; and the connection line overlaps with the first power supply voltage line at the display area.

* * * * *